US 12,364,173 B2

(12) United States Patent
Cheng et al.

(10) Patent No.: US 12,364,173 B2
(45) Date of Patent: Jul. 15, 2025

(54) RESISTIVE MEMORY CELL USING AN INTERFACIAL TRANSITION METAL COMPOUND LAYER AND METHOD OF FORMING THE SAME

(71) Applicant: Taiwan Semiconductor Manufacturing Company Limited, Hsinchu (TW)

(72) Inventors: Wen-Hao Cheng, Taichung (TW); Yuan-Huang Lee, Hsinchu (TW); Yu-Wen Liao, New Taipei (TW); Yen-Yu Chen, Taichung (TW); Hsuan-Chih Chu, Changhua County (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 606 days.

(21) Appl. No.: 17/517,724

(22) Filed: Nov. 3, 2021

(65) Prior Publication Data
US 2022/0223788 A1    Jul. 14, 2022

Related U.S. Application Data

(60) Provisional application No. 63/135,089, filed on Jan. 8, 2021.

(51) Int. Cl.
| | | |
|---|---|---|
| H10N 70/20 | (2023.01) | |
| H10B 63/00 | (2023.01) | |
| H10N 70/00 | (2023.01) | |

(52) U.S. Cl.
CPC ......... H10N 70/841 (2023.02); H10B 63/30 (2023.02); H10B 63/80 (2023.02); H10N 70/063 (2023.02);

(Continued)

(58) Field of Classification Search
CPC ............ H10N 70/826; H10N 70/8833; H10N 70/8836
See application file for complete search history.

(56) References Cited

U.S. PATENT DOCUMENTS

| | | | |
|---|---|---|---|
| 2020/0203603 A1 | 6/2020 | Glassman et al. | |
| 2020/0381622 A1 | 12/2020 | Chang et al. | |
| 2022/0223788 A1* | 7/2022 | Cheng | ................ H10N 70/826 |

FOREIGN PATENT DOCUMENTS

| | | |
|---|---|---|
| DE | 102013104112 A1 | 3/2014 |
| DE | 102014119172 A1 | 7/2015 |

(Continued)

OTHER PUBLICATIONS

Korean Patent and Trademark Office; KR Application No. 10-2022-0000817, 2nd Office Action, Patent Rejection Decision dated Oct. 21, 2024, 6 pages.

(Continued)

*Primary Examiner* — Mark V Prenty
(74) *Attorney, Agent, or Firm* — The Marbury Law Group, PLLC

(57) ABSTRACT

A resistive memory cell includes a lower electrode, a resistive transition metal oxide layer, and an upper electrode. The lower electrode includes at least one lower metallic barrier layer, a lower metal layer including a first metal having a melting point higher than 2,000 degrees Celsius, and a transition metal compound layer including an oxide or nitride of a transition metal selected from Ti, Ta, and W. The resistive transition metal oxide layer includes a conductive-filament-forming dielectric oxide of at least one transition metal and located on the transition metal compound layer. The upper electrode includes an upper metal layer including a second metal having a melting point higher than 2,000 degrees Celsius and at least one upper metallic barrier layer.

20 Claims, 11 Drawing Sheets

(52) U.S. Cl.
CPC ........... *H10N 70/24* (2023.02); *H10N 70/826* (2023.02); *H10N 70/8833* (2023.02); *H10N 70/8836* (2023.02)

(56) References Cited

FOREIGN PATENT DOCUMENTS

| | | |
|---|---|---|
| DE | 102019100488 A1 | 3/2020 |
| DE | 102019103777 A1 | 4/2020 |
| DE | 102019107906 A1 | 4/2020 |
| KR | 20170049337 A | 5/2017 |
| KR | 20190063423 A | 6/2019 |
| KR | 20200034920 A | 4/2020 |
| KR | 20210002327 A | 1/2021 |

OTHER PUBLICATIONS

German Patent and Trademark Office, Application No. 10 2022 100 007.9 First Examination Report mailed Oct. 24, 2022, 8 pages.
Korea, Lee International Patent Law Office; KR Application No. 10-2022-0000817, Office Action, Notice of Opinion dated Nov. 10, 2023, 18 pages.

\* cited by examiner

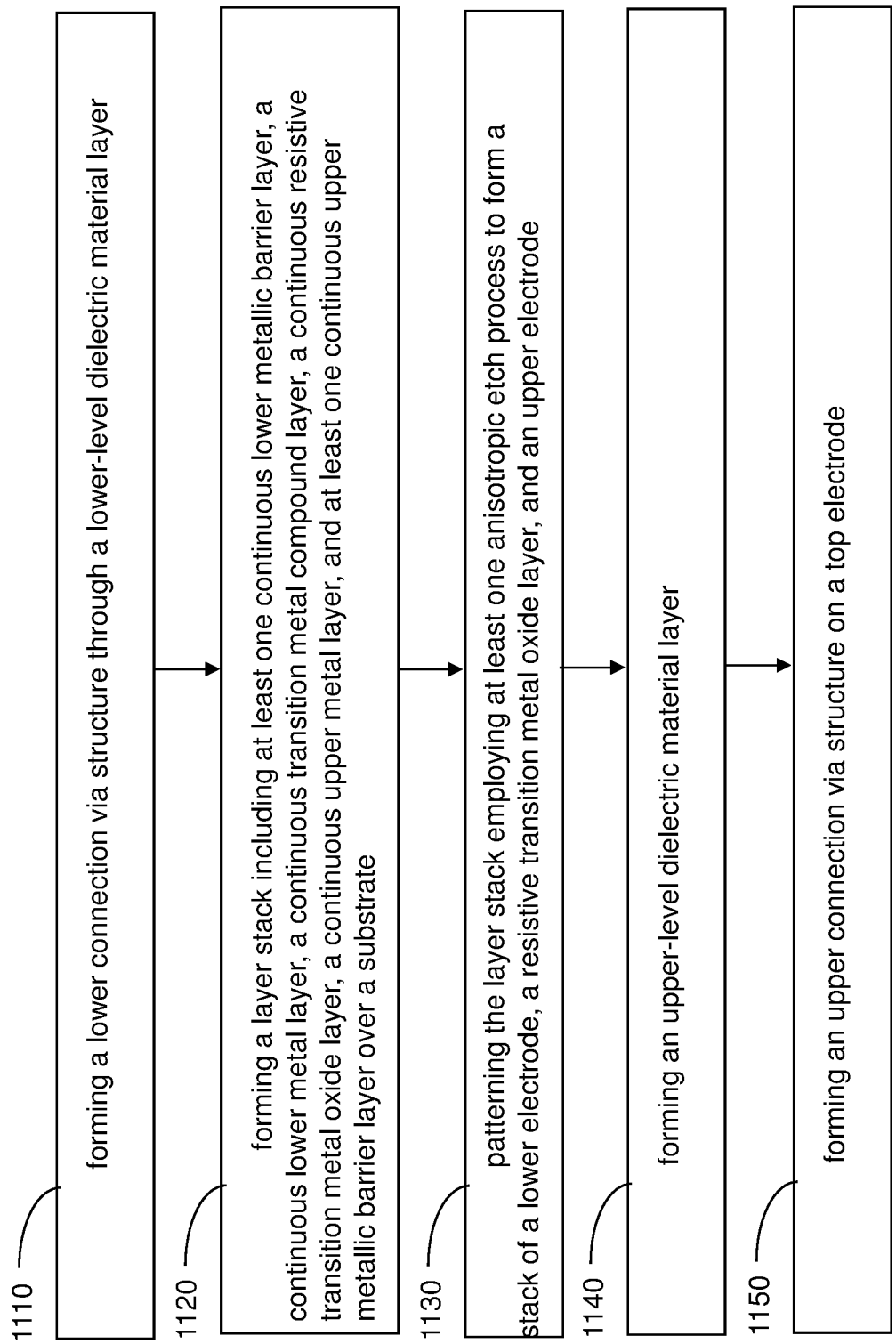

RESISTIVE MEMORY CELL USING AN INTERFACIAL TRANSITION METAL COMPOUND LAYER AND METHOD OF FORMING THE SAME

RELATED APPLICATIONS

This application claims the benefit of priority from U.S. Provisional Application No. 63/135,089 titled "Resistive random access memory (RRAM) structure and method for fabricating the same" filed on Jan. 8, 2021, the entire contents of which are hereby incorporated by reference for all purposes.

BACKGROUND

A resistive memory cell includes a resistive memory element, in which a data bit may be encoded as a low resistance state or as a high resistance state. A plurality of resistive memory cells may be arranged as a two-dimensional array or as a three-dimensional array to provide a random access resistive memory array. Reliability of a resistive memory cell depends on how well the resistive memory cell retains original device characteristics after repeated programming operations, erase operations, and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flowchart that illustrates a sequence of processing steps for manufacturing a resistive memory device of the present disclosure.

DETAILED DESCRIPTION

Figure 1:
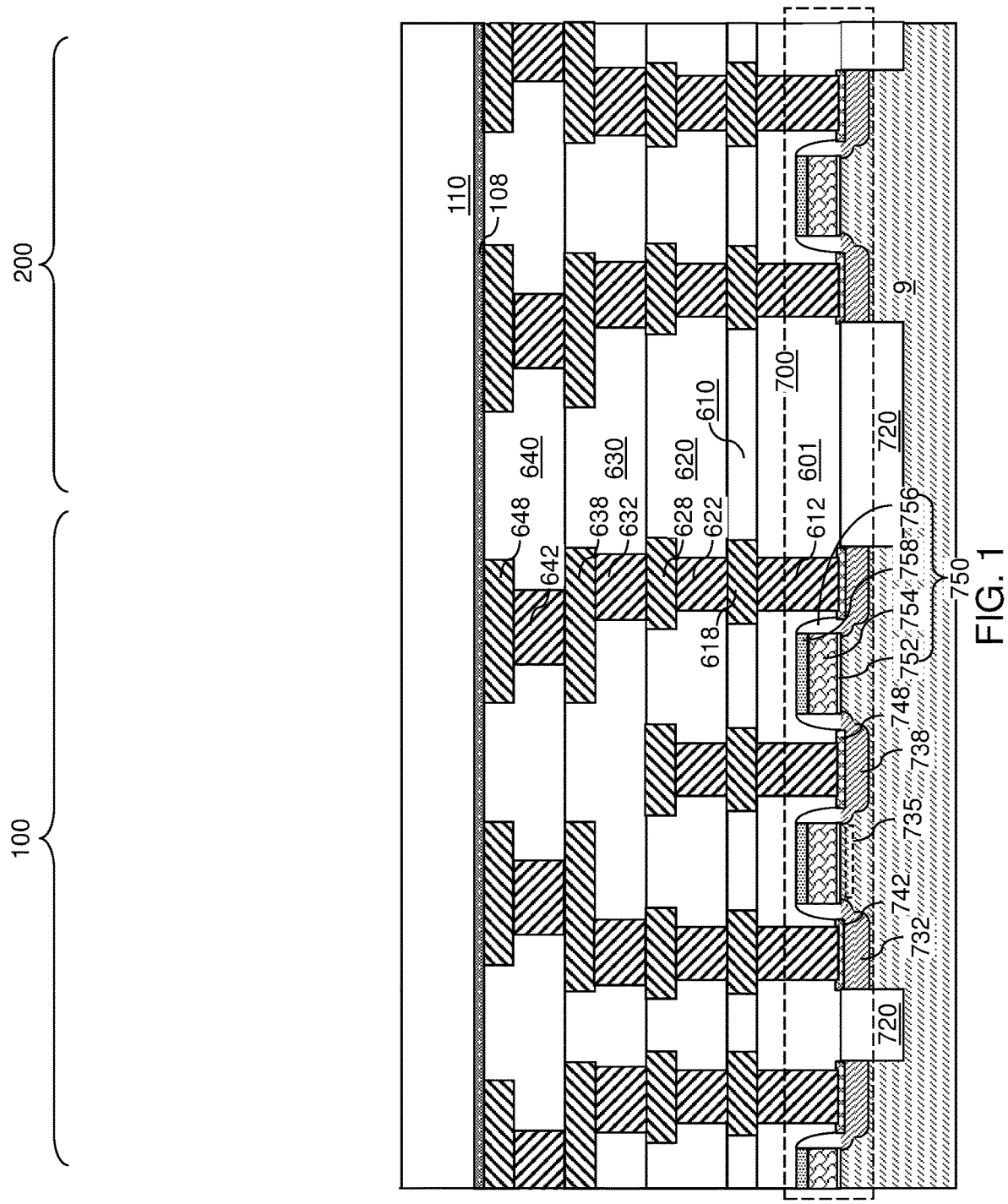
FIG. 1 is a vertical cross-sectional view of an exemplary structure after formation of complementary metal-oxide-semiconductor (CMOS) transistors, metal interconnect structures embedded in dielectric material layers, and a lower connection-via-level dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a memory cell providing enhanced endurance for a resistive memory element while minimizing adverse impact on resistance of a lower electrode. Specifically, an interfacial transition metal compound layer may be provided between a high conductivity metal of a lower metal layer in a lower electrode and a resistive transition metal oxide layer that has at least two resistive states providing different electrical resistivity. The resistive transition metal oxide layer may include a filament-forming dielectric metal oxide material, and permanent structural damage to the resistive transition metal oxide layer through repeated formation and erasure of conductive filaments within the resistive transition metal oxide layer may be retarded through use of the interfacial transition metal compound layer between the lower metal layer and the resistive transition metal oxide layer. Aspects of various embodiments of the present disclosure are described with reference to accompanying drawings herebelow.

FIG. 1 is a vertical cross-sectional view of an exemplary structure after formation of complementary metal-oxide-semiconductor (CMOS) transistors, metal interconnect structures formed within lower-level dielectric material layers, and a connection-via-level dielectric layer according to an embodiment of the present disclosure. The exemplary structure includes complementary metal-oxide-semiconductor (CMOS) transistors and metal interconnect structures formed in dielectric material layers. Specifically, the exemplary structure includes a substrate 9, which may be a semiconductor substrate such as a commercially available silicon wafer. Shallow trench isolation structures 720 including a dielectric material such as silicon oxide may be formed in an upper portion of the substrate 9. Suitable doped semiconductor wells, such as p-type wells and n-type wells, may be formed within each area that may be laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The exemplary structure may include a memory array region 100 in which an array of memory elements may be subsequently formed, and a peripheral region 200 in which logic devices that support operation of the array of memory elements may be formed. In one embodiment, devices (such as field effect transistors) in the memory array region 100 may include lower electrode access transistors that provide access to lower electrodes of memory cells to be subsequently formed. Upper electrode access transistors that provide access to upper electrodes of memory cells to be subsequently formed may be formed in the peripheral region 200 at this processing step. Devices (such as field effect transistors) in the peripheral region 200 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a upper electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures embedded in dielectric material layers may be subsequently formed over the substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contacting a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 may include source lines that are connected a source-side power supply for an array of memory elements. The voltage provided by the source lines may be applied to the lower electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells is formed over the fourth line-and-via-level dielectric material layer 640, embodiments are expressly contemplated herein in which the array of memory cells may be formed at a different metal interconnect level.

The dielectric material layers (601, 610, 620, 630, 640) may be located at a lower level relative to an array of memory cells to be subsequently formed. As such, the dielectric material layers (601, 610, 620, 630, 640) are herein referred to as lower-level dielectric material layers, i.e., dielectric material layer located at lower levels relative to the array of memory cells to be subsequently formed. The metal interconnect structures (612, 618, 622, 628, 632, 638, 642, 648) are herein referred to as lower-level metal interconnect structures. A subset of the metal interconnect structures (612, 618, 622, 628, 632, 638, 642, 648) includes lower-level metal lines (such as the fourth metal line structures 648) that are embedded in the lower-level dielectric layers and having top surfaces within a horizontal plane including a topmost surface of the lower-level dielectric layers. Generally, the total number of metal line levels within the lower-level dielectric layers (601, 610, 620, 630, 640) may be in a range from 1 to 10.

A dielectric cap layer 108 and a lower connection-via-level dielectric layer 110 may be sequentially formed over the metal interconnect structures and the dielectric material layers. The continuous dielectric cap layer 108 and the lower connection-via-level dielectric layer 110 may be additional lower-level dielectric material layers. For example, the dielectric cap layer 108 may be formed on the top surfaces of the fourth metal line structures 648 and on the top surface of the fourth line-and-via-level dielectric material layer 640. The dielectric cap layer 108 includes a dielectric capping material that may protect underlying metal interconnect structures such as the fourth metal line structures 648. In one embodiment, the dielectric cap layer 108 may include a material that may provide high etch resistance, i.e., a dielectric material and also may function as an etch stop material during a subsequent anisotropic etch process that etches the lower connection-via-level dielectric layer 110. For example, the dielectric cap layer 108 may include silicon carbide or silicon nitride, and may have a thickness in a range from 5 nm to 30 nm, although lesser and greater thicknesses may also be used.

The lower connection-via-level dielectric layer 110 may include any material that may be used for the dielectric material layers (601, 610, 620, 630, 640). For example, the lower connection-via-level dielectric layer 110 may include undoped silicate glass or a doped silicate glass deposited by decomposition of tetraethylorthosilicate (TEOS). The thickness of the lower connection-via-level dielectric layer 110 may be in a range from 50 nm to 200 nm, although lesser and greater thicknesses may also be used. The dielectric cap layer 108 and the lower connection-via-level dielectric layer 110 may be formed as planar blanket (unpatterned) layers having a respective planar top surface and a respective planar bottom surface that extends throughout the memory array region 100 and the peripheral region 200.

Figure 2:
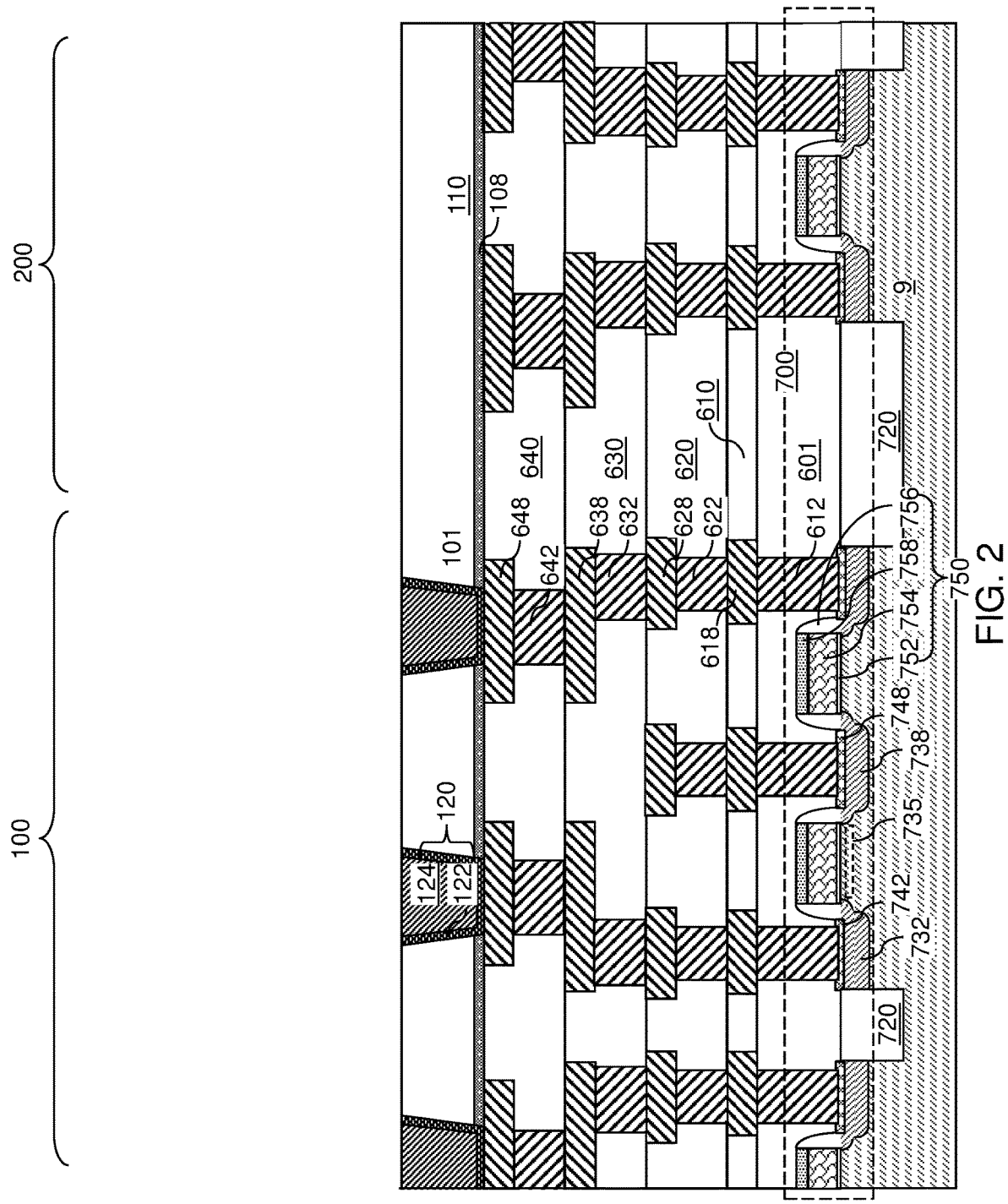
FIG. 2 is a vertical cross-sectional view of the exemplary structure after formation of an array of lower connection via structures according to an embodiment of the present disclosure.

FIG. 2 is a vertical cross-sectional view of the exemplary structure after formation of an array of lower connection via structures 120 according to an embodiment of the present disclosure. Via cavities may be formed through the lower connection-via-level dielectric layer 110 and the dielectric cap layer 108 of the exemplary structure. For example, a photoresist layer (not shown) may be applied over the lower connection-via-level dielectric layer 110 and may be patterned to form opening within areas of the memory array region 100 that overlie a respective one of the fourth metal line structures 648. An anisotropic etch may be performed to transfer the pattern in the photoresist layer through the lower connection-via-level dielectric layer 110 and the dielectric cap layer 108. The via cavities formed by the anisotropic etch process are herein referred to as lower-electrode-contact via cavities because lower electrode connection via structures are subsequently formed in the lower-electrode-contact via cavities. The lower-electrode-contact via cavities may have tapered sidewalls having a taper angle (with respect to a vertical direction) in a range from 1 degree to 10 degrees. A top surface of a fourth metal line structure 648 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the fourth metal line structures 648, tapered sidewalls of the lower-electrode-contact via cavities, and the top surface of the lower connection-via-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the lower connection-via-level dielectric layer 110 may be removed by a planarization process such as chemical mechanical planarization. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a lower connection via structure 120. An array of lower connection via structures 120 may be formed in the lower connection-via-level dielectric layer 110 on underlying metal interconnect structures. The array of lower connection via structures 120 may contact top surfaces of a subset of the fourth metal line structures 648. Generally, the array of lower connection via structures 120 contacts top surfaces of a subset of lower-level metal lines located at the topmost level of the lower-level dielectric layers (601, 610, 620, 630, 640).

Figure 3:
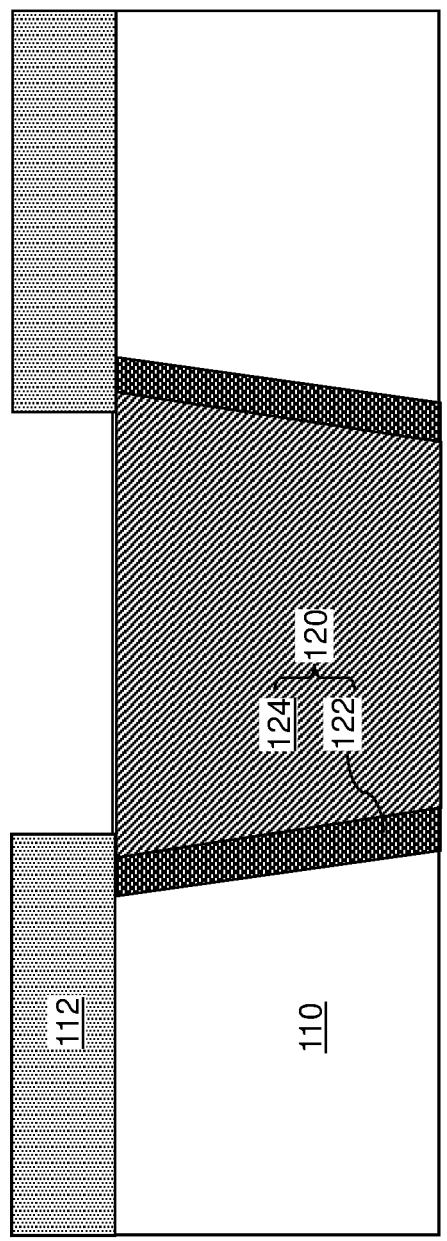
FIG. 3 is a vertical cross-sectional view of a memory cell region of the exemplary structure after formation of a dielectric etch stop layer according to an embodiment of the present disclosure.

Referring to FIG. 3, a memory cell region of the exemplary structure is illustrated after formation of a dielectric etch stop layer 112. The dielectric etch stop layer 112 may include a dielectric material that may be used as an etch stop structure during a subsequent anisotropic etch process. For example, the dielectric etch stop layer 112 may include a dielectric material such as silicon carbide, silicon carbide nitride, silicon nitride, silicon oxynitride, or a dielectric metal oxide such as aluminum oxide, lanthanum oxide, or titanium oxide. Other suitable dielectric materials are within the contemplated scope of disclosure. The dielectric etch stop layer 112 may be deposited by chemical vapor deposition or atomic layer deposition. The thickness of the dielectric etch stop layer 112 may be in a range from 3 nm to 100 nm, such as from 10 nm to 50 nm, although lesser and greater thicknesses may also be used.

A photoresist layer (not shown) may be applied over the dielectric etch stop layer 112, and may be lithographically patterned to form an array of openings. Each opening may have a respective periphery that is laterally offset inward from a periphery of an underlying one of the lower connection via structures 120 in a plan view. In other words, the area of each opening within the photoresist layer may be located entirely within the area of an underlying one of the lower connection via structures 120. The pattern in the photoresist layer may be transferred through the dielectric etch stop layer 112 by an anisotropic etch process, which has an etch chemistry that etches the material of the dielectric etch stop layer 112 selective to the metallic materials of the lower connection via structures 120. The photoresist layer may be subsequently removed, for example, by ashing.

Generally, a dielectric etch stop layer 112 including an array of openings may be formed over the array of the lower connection via structures 120 over the lower-level dielectric material layers (601, 610, 620, 630, 640). The horizontal cross-sectional shape of each opening through the dielectric etch stop layer 112 may be a circle, an ellipse, a rectangle, a rounded rectangle, or any two-dimensional curvilinear shape having a closed periphery. The maximum lateral dimension (such as a diameter or a major axis) of each opening through the dielectric etch stop layer 112 may be in a range from 10 nm to 100 nm, such as from 20 nm to 50 nm, although lesser and greater maximum lateral dimensions may also be used.

Figure 4:
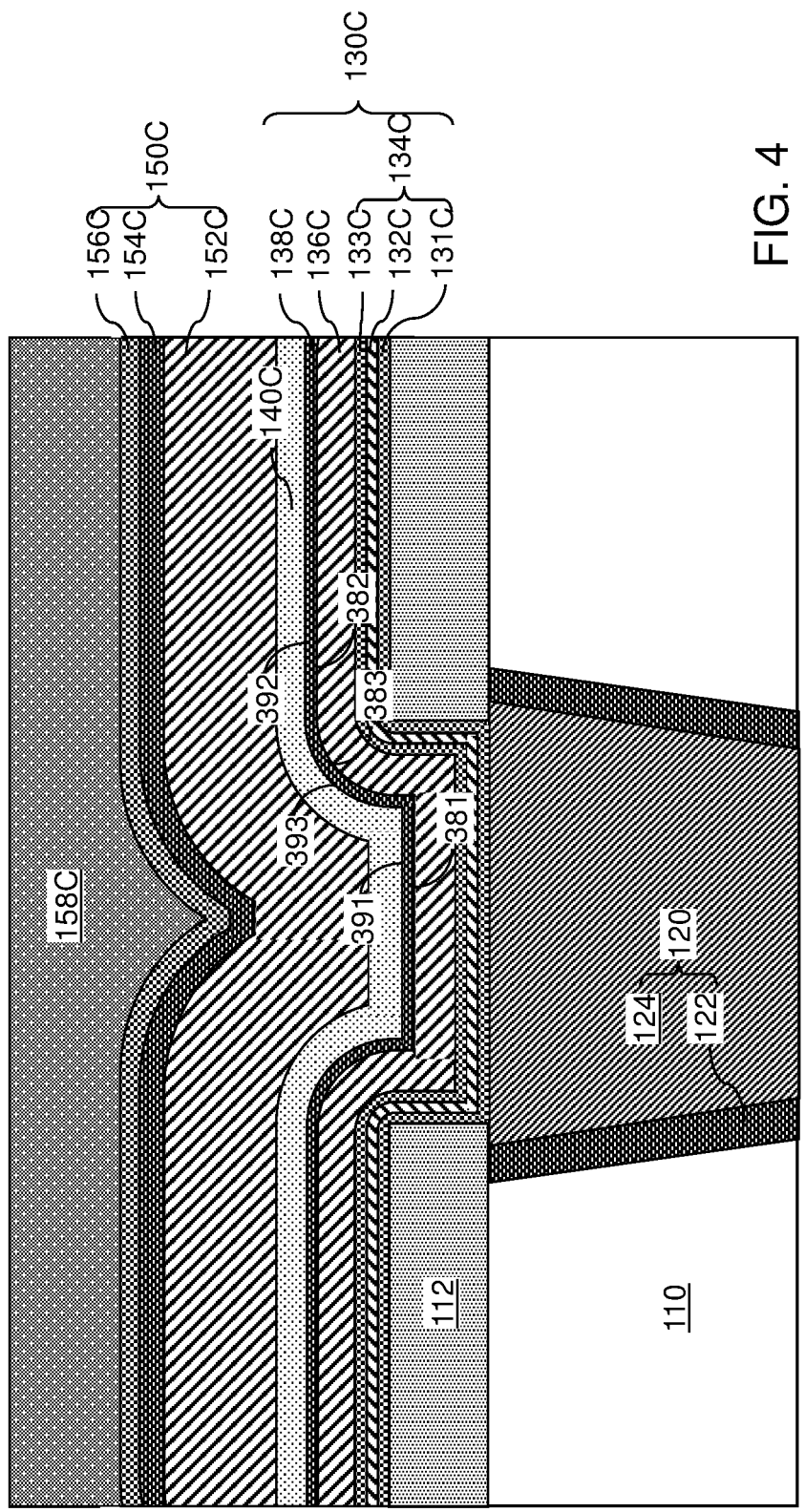
FIG. 4 is a vertical cross-sectional view of a memory cell region of the exemplary structure after formation of a layer stack including at least one continuous lower metallic barrier layer, a continuous lower metal layer, a continuous transition metal compound layer, a continuous resistive transition metal oxide layer, a continuous upper metal layer, at least one continuous upper metallic barrier layer, and a continuous dielectric cap layer according to an embodiment of the present disclosure.

Referring to FIG. 4, a layer stack including at least one continuous lower metallic barrier layer 134C, a continuous lower metal layer 136C, a continuous transition metal compound layer 138C, a continuous resistive transition metal oxide layer 140C, a continuous upper metal layer 152C, at least one continuous upper metallic barrier layer (154C, 156C), and a continuous dielectric cap layer 158C may be deposited in the array of openings on physically exposed surfaces of the lower connection via structures 120 and over the dielectric etch stop layer 112. The combination of the at least one continuous lower metallic barrier layer 134C, the continuous lower metal layer 136C, and the continuous transition metal compound layer 138C is subsequently used to pattern lower electrodes, and thus, is herein referred to as continuous lower electrode material layers 130C. The combination of the continuous upper metal layer 152C and the at least one continuous upper metallic barrier layer (154C, 156C) is subsequently used to pattern upper electrodes, and thus, is herein referred to as continuous upper electrode material layers 150C.

In one embodiment, the at least one continuous lower metallic barrier layer 134C may include a plurality of continuous lower metallic barrier layers such as a stack including, from bottom to top, a first continuous lower metallic barrier layer 131C, a second continuous lower metallic barrier layer 132C, and a third continuous lower metallic barrier layer 133C. In one embodiment, the first continuous lower metallic barrier layer 131C may include a first conductive metallic nitride material such as TaN, TiN, or WN. The second continuous lower metallic barrier layer 132C may include an elemental metal such as Ta, Ti, or W. The third continuous lower metallic barrier layer 133C may include a second conductive metallic nitride material such as TaN, TiN, or WN. The second conductive metallic nitride material may be the same as, or may be different from, the first conductive metallic nitride material. Each of the first continuous lower metallic barrier layer 131C, the second continuous lower metallic barrier layer 132C, and the third continuous lower metallic barrier layer 133C may have a respective thickness in a range from 1 nm to 100 nm, such as from 3 nm to 30 nm, although lesser and greater thicknesses may also be used.

Each of the first continuous lower metallic barrier layer 131C, the second continuous lower metallic barrier layer 132C, and the third continuous lower metallic barrier layer 133C may be deposited by a respective deposition process such as a physical vapor deposition or a chemical vapor deposition. The thickness of each of the first continuous lower metallic barrier layer 131C, the second continuous lower metallic barrier layer 132C, and the third continuous lower metallic barrier layer 133C may be in a range from 2 nm to 40 nm, such as from 4 nm to 20 nm, although lesser and greater thicknesses may be used. The atomic percentage of nitrogen atoms within each of the first continuous lower metallic barrier layer 131C and the third continuous lower metallic barrier layer 133C may be uniform, or may be graded, to reduce electrical resistance and to increase electromigration resistance.

In one embodiment, the continuous lower metal layer 136C comprises a first metal having a melting point higher than 2,000 degrees Celsius. For example, the continuous lower metal layer 136C may include hafnium, ruthenium, iridium, niobium, molybdenum, tantalum, osmium, rhenium, or tungsten. Other suitable metal materials may be within the contemplated scope of disclosure. In one embodiment, the continuous lower metal layer 136C may include a group 8 element (such as ruthenium or osmium) or a group 9 element (such as rhodium or iridium). Generally, use of a metal having a high melting point for the continuous lower metal layer 136C may be advantageous for the purpose of reducing, or eliminating, atoms of the first metal within lower electrodes during operation of resistive memory cells. In one embodiment, the continuous lower metal layer 136C may include ruthenium. The continuous lower metal layer 136C may be deposited by physical vapor deposition or chemical vapor deposition. The thickness of the continuous lower metal layer 136C may be in a range from 1 nm to 100 nm, such as from 3 nm to 30 nm and/or from 6 nm to 20 nm, although lesser and greater thicknesses may also be used.

According to an aspect of the present disclosure, the continuous transition metal compound layer 138C comprises, and/or consists essentially of, an oxide or nitride of a transition metal selected from Ti, Ta, and W. In one embodiment, the continuous transition metal compound layer 138C comprises, and/or consists essentially of, a transition metal oxide material selected from titanium oxide and tantalum oxide. In one embodiment, the continuous resistive transition metal oxide layer 140C may be free of the metal included in the continuous lower metal layer 136C. In this embodiment, the metal of the continuous lower metal layer 136C may be free of tantalum, titanium, or tungsten. In one embodiment, the continuous transition metal compound layer 138C may be formed by deposition of a metallic compound material instead of deposition of a metal and subsequent nitridation or subsequent oxidation. In one embodiment, the continuous transition metal compound layer 138C may have a uniform non-metallic atomic percentage throughout.

In one embodiment, the continuous transition metal compound layer 138C comprises, and/or consists essentially of titanium oxide. In this embodiment, the continuous transition metal compound layer 138C may have a uniform oxygen atomic percentage or a uniform nitrogen atomic percentage throughout.

In one embodiment, the titanium oxide material of the continuous transition metal compound layer 138C may be deposited by an atomic layer deposition process. In this embodiment, a titanium-containing precursor gas (such as tetrakis(dimethylamino)titanium ($Ti(N(CH_3)_2)_4$; TDMAT), titanium tetrachloride ($TiCl_4$), or titanium tetraisopropoxide (TTIP)) and an oxygen source gas (such as $H_2O$, $O_3$, or $O_2$) may be alternately flowed into a process chamber including the exemplary structure during the atomic layer deposition process. The process temperature may be in a range from 0 degrees Celsius to 400 degrees Celsius, such as from 10 degrees Celsius to 350 degrees Celsius, although lower and higher process temperatures may also be used. The flow rate for the titanium-containing precursor gas and for the oxygen source gas may be in a range from 40 standard cubic centimeters per minute (sccm) to 1,000 sccm, although lesser and greater flow rates may also be used. The total number of cycles (i.e., the number of repetition of flow of the titanium-containing precursor gas and flow of the oxygen source gas) may be in a range from 1 to 50, such as from 3 to 20, although lesser and greater number of cycles may also be used. The thickness of the continuous transition metal compound layer 138C may be in a range from 0.5 nm to 10 nm, such as from 1.5 nm to 4 nm, although lesser and greater thicknesses may also be used.

In one embodiment, the continuous transition metal compound layer 138C comprises, and/or consists essentially of tantalum oxide. In one embodiment, the tantalum oxide material of the continuous transition metal compound layer 138C may be deposited by an atomic layer deposition process. In this embodiment, a tantalum-containing precursor gas (such as $Ta(OC_2H_5)_5$, $Ta(N(CH_3)_2)_5$, $TaCl_5$, $TaI_5$, or tert-butylimido-tris-ethylmethylamido-tantalum) and an oxygen source gas (such as $H_2O$, $O_3$, or $O_2$) may be alternately flowed into a process chamber including the exemplary structure during the atomic layer deposition process. The process temperature may be in a range from 0 degrees Celsius to 400 degrees Celsius, such as from 20 degrees Celsius to 350 degrees Celsius, although lower and higher process temperatures may also be used. The flow rate for the tantalum-containing precursor gas and for the oxygen source gas may be in a range from 40 standard cubic centimeters per minute (sccm) to 1,000 sccm, although lesser and greater flow rates may also be used. The total number of cycles (i.e., the number of repetition of flow of the tantalum-containing precursor gas and flow of the oxygen source gas) may be in a range from 1 to 50, such as from 3 to 20, although lesser and greater number of cycles may also be used. The thickness of the continuous transition metal compound layer 138C may be in a range from 0.5 nm to 10 nm, such as from 1.5 nm to 4 nm, although lesser and greater thicknesses may also be used.

In one embodiment, the continuous transition metal compound layer 138C comprises, and/or consists essentially of, a transition metal nitride material selected from titanium nitride, tantalum nitride, and tungsten nitride.

In one embodiment, the continuous transition metal compound layer 138C comprises, and/or consists essentially of titanium nitride. In one embodiment, the titanium nitride material of the continuous transition metal compound layer 138C may be deposited by an atomic layer deposition process. In this embodiment, a titanium-containing precursor gas (such as tetrakis(dimethylamino)titanium ($Ti(N(CH_3)_2)_4$; TDMAT), titanium tetrachloride ($TiCl_4$), or titanium tetraisopropoxide (TTIP)) and a nitrogen source gas (such as $NH_3$ or $N_2$) may be alternately flowed into a process chamber including the exemplary structure during the atomic layer deposition process. The process temperature may be in a range from 150 degrees Celsius to 400 degrees Celsius, such as from 200 degrees Celsius to 350 degrees Celsius, although lower and higher process temperatures may also be used. The flow rate for the titanium-containing precursor gas and for the nitrogen source gas may be in a range from 40 standard cubic centimeters per minute (sccm) to 1,000 sccm, although lesser and greater flow rates may also be used. The total number of cycles (i.e., the number of repetition of flow of the titanium-containing precursor gas and flow of the nitrogen source gas) may be in a range from 1 to 50, such as from 3 to 20, although lesser and greater number of cycles may also be used. The thickness of the continuous transition metal compound layer 138C may be in a range from 0.5 nm to 10 nm, such as from 1.5 nm to 4 nm, although lesser and greater thicknesses may also be used.

In one embodiment, the titanium nitride material of the continuous transition metal compound layer 138C may be deposited by physical vapor deposition in an ultrahigh vacuum chamber. In this embodiment, at least one inert gas such as nitrogen gas or argon gas may be used as an ambient gas during the physical vapor deposition process. The flow rate of the nitrogen gas and/or the flow rate of the argon gas may be in a range from 1 sccm to 300 sccm, although lesser and greater flow rates may also be used. The deposition temperature during the physical vapor deposition process may be in a range from 0 degree Celsius to 300 degrees Celsius, although lower and higher temperatures may also be used. The DC power used during the physical vapor deposition process may be in a range from 10 Watts to 6,000 Watts, such as from 30 Watts to 2,000 Watts, although lesser and greater powers may also be used. The thickness of the continuous transition metal compound layer 138C may be in a range from 0.5 nm to 10 nm, such as from 1.5 nm to 4 nm, although lesser and greater thicknesses may also be used.

In one embodiment, the titanium nitride material of the continuous transition metal compound layer 138C may be deposited by an atomic layer deposition process. In this embodiment, a titanium-containing precursor gas (such as tetrakis(dimethylamino)titanium ($Ti(N(CH_3)_2)_4$; TDMAT), titanium tetrachloride ($TiCl_4$), or titanium tetraisopropoxide (TTIP)) and a nitrogen source gas (such as $NH_3$) may be alternately flowed into a process chamber including the exemplary structure during the atomic layer deposition process. The process temperature may be in a range from 150 degrees Celsius to 600 degrees Celsius, such as from 300 degrees Celsius to 550 degrees Celsius, although lower and higher process temperatures may also be used. The flow rate for the titanium-containing precursor gas and for the nitrogen source gas may be in a range from 1 standard cubic centimeters per minute (sccm) to 500 sccm, although lesser and greater flow rates may also be used. Optionally, a carrier gas such as helium gas may be flowed into the process chamber during the deposition process. Radio-frequency (RF) power applied to generate plasmas of the titanium-containing precursor gas and the nitrogen source gas may be in a range from 10 Watts to 3,000 Watts, such as from 50 Watts to 1,000 Watts, although lesser and greater RF powers may also be used. The thickness of the continuous transition metal compound layer 138C may be in a range from 0.5 nm to 10 nm, such as from 1.5 nm to 4 nm, although lesser and greater thicknesses may also be used.

In one embodiment, the tantalum nitride material of the continuous transition metal compound layer 138C may be deposited by physical vapor deposition in an ultrahigh vacuum chamber. In this embodiment, at least one inert gas such as nitrogen gas or argon gas may be used as an ambient gas during the physical vapor deposition process. The flow rate of the nitrogen gas and/or the flow rate of the argon gas may be in a range from 1 sccm to 300 sccm, although lesser and greater flow rates may also be used. The deposition temperature during the physical vapor deposition process may be in a range from 0 degree Celsius to 300 degrees Celsius, although lower and higher temperatures may also be used. The DC power used during the physical vapor deposition process may be in a range from 10 Watts to 6,000 Watts, such as from 30 Watts to 2,000 Watts, although lesser and greater powers may also be used. Optionally, coil power may be used during the physical vapor deposition process. In this embodiment, the magnitude of the coil power may be in a range from 10 Watts to 2,000 Watts, although lesser and greater magnitudes may also be used. The thickness of the continuous transition metal compound layer 138C may be in a range from 0.5 nm to 10 nm, such as from 1.5 nm to 4 nm, although lesser and greater thicknesses may also be used.

In one embodiment, the continuous transition metal compound layer 138C comprises, and/or consists essentially of tungsten nitride. In one embodiment, the tungsten nitride material of the continuous transition metal compound layer 138C may be deposited by an atomic layer deposition process. In this embodiment, a tungsten-containing precursor gas (such as tungsten hexafluoride) and a nitrogen source gas (such as $NH_3$ or $N_2$) may be alternately flowed into a process chamber including the exemplary structure during the chemical vapor deposition process. The process temperature may be in a range from 150 degrees Celsius to 600 degrees Celsius, such as from 200 degrees Celsius to 500 degrees Celsius, although lower and higher process temperatures may also be used. The flow rate for the tungsten-containing precursor gas and for the nitrogen source gas may be in a range from 40 standard cubic centimeters per minute (sccm) to 1,000 sccm, although lesser and greater flow rates may also be used. The total number of cycles (i.e., the number of repetition of flow of the tungsten-containing precursor gas and flow of the nitrogen source gas) may be in a range from 1 to 50, such as from 3 to 20, although lesser and greater number of cycles may also be used. The thickness of the continuous transition metal compound layer 138C may be in a range from 0.5 nm to 10 nm, such as from 1.5 nm to 4 nm, although lesser and greater thicknesses may also be used.

The continuous resistive transition metal oxide layer 140C comprises, and/or consists essentially of, a conductive-filament-forming dielectric oxide of at least one transition metal. A conductive-filament-forming dielectric oxide refers to a dielectric oxide that may form conductive filaments upon application of an electrical field therethrough. Exemplary conductive-filament-forming dielectric oxides include hafnium oxide, zirconium oxide, titanium oxide, hafnium zirconium oxide, and strontium cobalt oxide. The electrical resistivity of the continuous resistive transition metal oxide layer 140C along the thickness direction (e.g., along the vertical direction) may change by at least one order of magnitude, such as 2 to 6 orders of magnitude, upon formation of conductive filaments therein through application of an electrical bias voltage.

In embodiments in which the continuous resistive transition metal oxide layer 140C comprises hafnium oxide, a vertical electrical field having a magnitude of about 2.6 MV/cm may be used to form conductive filaments therein. An electrical field along the opposite polarity and having a lesser magnitude may be applied to remove the conductive filaments from within the continuous resistive transition metal oxide layer 140C.

The continuous resistive transition metal oxide layer 140C may be deposited by atomic layer deposition, chemical vapor deposition, or physical vapor deposition. For example, if the continuous resistive transition metal oxide layer 140C comprises hafnium oxide, an atomic layer deposition using a hafnium-containing precursor gas (such as hafnium tetrachloride) and an oxygen source gas (such as $H_2O$, $O_2$, or $O_3$) may be alternately flowed into a process chamber containing the exemplary structure to deposit the continuous resistive transition metal oxide layer 140C. The thickness of the continuous resistive transition metal oxide layer 140C may be in a range from 1 nm to 50 nm, such as from 3 nm to 20 nm and/or from 6 nm to 10 nm, although lesser and greater thicknesses may also be used.

The continuous upper metal layer 152C comprises, and/or consists essentially of, a second metal having a melting point higher than 2,000 degrees Celsius. For example, the continuous upper metal layer 152C may include hafnium, ruthenium, iridium, niobium, molybdenum, tantalum, osmium, rhenium, or tungsten. Generally, use of a metal having a high melting point for the continuous upper metal layer 152C is advantageous for the purpose of reducing, or eliminating, atoms of the first metal within lower electrodes during operation of resistive memory cells. In one embodiment, the continuous upper metal layer 152C may include, and/or may consist essentially of, a metal that is different than any component metal of the continuous resistive transition metal oxide layer 140C. In one embodiment, the continuous resistive transition metal oxide layer 140C may consist essentially of tantalum. The continuous resistive transition metal oxide layer 140C may be deposited by physical vapor deposition or chemical vapor deposition. The thickness of the continuous upper metal layer 152C may be in a range from 4 nm to 100 nm, such as from 8 nm to 50 nm, although lesser and greater thicknesses may also be used.

The at least one continuous upper metallic barrier layer (154C, 156C) may include a plurality of continuous upper metallic barrier layers such as a stack including, from bottom to top, a first continuous upper metallic barrier layer 154C and a second continuous upper metallic barrier layer 156C. In one embodiment, the first continuous upper metallic barrier layer 154C may include a conductive metallic nitride material such as TaN, TiN, or WN. The second continuous upper metallic barrier layer 156C may include another conductive metallic nitride material such as TaN, TiN, or WN, which may be the same as, or may be different from, the conductive metallic nitride material.

Each of the first continuous upper metallic barrier layer 154C and the second continuous upper metallic barrier layer 156C may be deposited by a respective deposition process such as a physical vapor deposition or a chemical vapor deposition. The thickness of each of the first continuous upper metallic barrier layer 154C and the second continuous upper metallic barrier layer 156C may be in a range from 1 nm to 100 nm, such as from 3 nm to 30 nm, although lesser and greater thicknesses may be used. The atomic percentage of nitrogen atoms within each of the first continuous upper metallic barrier layer 154C and the second continuous upper metallic barrier layer 156C may be uniform, or may be graded, to reduce electrical resistance and to increase electromigration resistance.

The continuous dielectric cap layer 158C may be formed over the at least one continuous upper metallic barrier layer (154C, 156C). The continuous dielectric cap layer 158C includes a dielectric material such as silicon oxide, silicon oxynitride, silicon carbide, or silicon carbide nitride. In one embodiment, the continuous dielectric cap layer 158C may consist essentially of silicon nitride. The continuous dielectric cap layer 158C may be deposited by a chemical vapor deposition process such as a plasma-enhanced chemical vapor deposition process. The thickness of the continuous dielectric cap layer 158C over a planar portion of the at least one continuous upper metallic barrier layer (154C, 156C) may be in a range from 10 nm to 500 nm, such as from 30 nm to 100 nm, although lesser and greater thicknesses may also be used.

Generally, the layer stack (130C, 140C, 150C, 158C) may be formed over the top surface of the dielectric etch stop layer 112, and protrude into each opening through the dielectric etch stop layer 112. Each downward-protruding portion of the layer stack (130C, 140C, 150C, 158C) fills a respective opening through the dielectric etch stop layer 112.

A planar portion of the layer stack (130C, 140C, 150C, 158C) overlies the planar top surface of the dielectric etch stop layer 112.

Within and around each opening in the dielectric etch stop layer 112, the continuous transition metal compound layer 138C comprises a bottom surface including a planar central bottom surface segment 381 located within the area of the opening through the dielectric etch stop layer 112, a planar peripheral bottom surface segment 382 located outside the area of the opening through the dielectric etch stop layer 112, and a concave connecting bottom surface segment 383 that connects the planar central bottom surface segment 381 and the planar peripheral bottom surface segment 382. Within and around each opening in the dielectric etch stop layer 112, the continuous transition metal compound layer 138C comprises a top surface including a planar central top surface segment 391 located within an area of the opening through the dielectric etch stop layer 112, a planar peripheral top surface segment 392 located outside the area of the opening through the dielectric etch stop layer 112, and a convex connecting top surface segment 393 that connects the planar central top surface segment 391 and the planar peripheral top surface segment 392.

Figure 5:
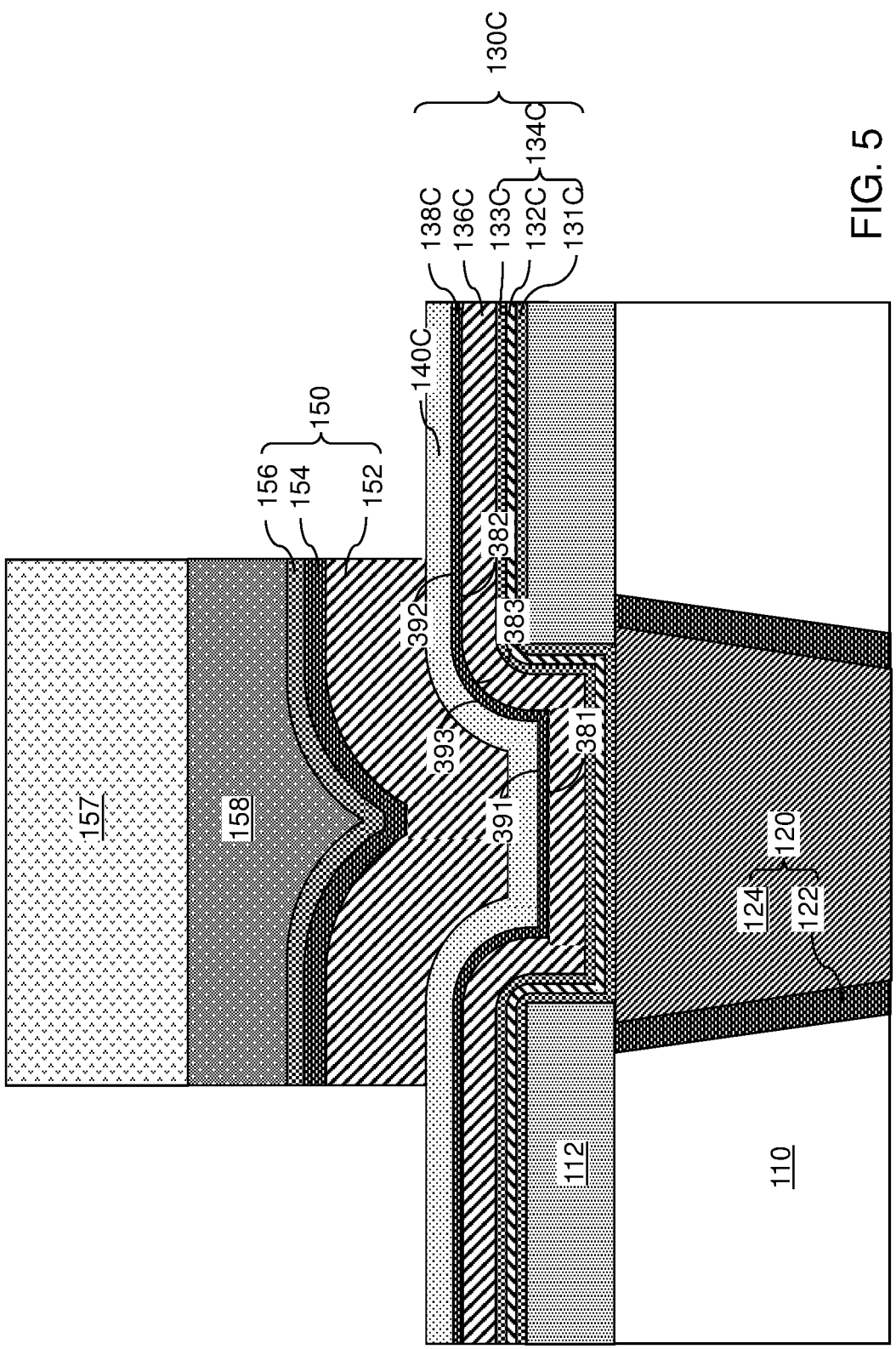
FIG. 5 is a vertical cross-sectional view of a memory cell region of the exemplary structure after patterning the dielectric cap layer, the at least one continuous upper metallic barrier layer, and the continuous upper metal layer according to an embodiment of the present disclosure.

Referring to FIG. 5, an etch mask layer 157 (such as a photoresist layer) may be applied over the layer stack (130C, 140C, 150C, 158C), and may be lithographically patterned to form an array of patterned etch mask portions. Each patterned etch mask portion may overlie, and cover, the area of a respective one of the openings in the dielectric etch stop layer 112. Each patterned etch mask portion may have a respective horizontal cross-sectional shape of a circle, an ellipse, a rectangle, a rounded rectangle, or any two-dimensional curvilinear horizontal cross-sectional shape having a closed periphery.

A first anisotropic etch process may be performed to transfer the pattern in the etch mask layer 157 through the continuous dielectric cap layer 158C and the continuous upper electrode material layers 150C. The etch chemistry of the first anisotropic etch process may be selected such that the first anisotropic etch process etches through the materials of the continuous dielectric cap layer 158C and the continuous upper electrode material layers 150C. A terminal step of the first anisotropic etch process may have an etch chemistry that is selective to the material of the continuous resistive transition metal oxide layer 140C.

Remaining patterned portions of the continuous dielectric cap layer 158C comprise an array of dielectric caps 158. Remaining patterned portions of the second continuous upper metallic barrier layer 156C comprise an array of second upper metallic barrier layers 156. Remaining patterned portions of the first continuous upper metallic barrier layer 154C comprise an array of first upper metallic barrier layers 154. Remaining patterned portions of the continuous upper metal layer 152C comprise an upper metal layer 152. Within each memory cell region overlying an opening in the dielectric etch stop layer 112, a stack of an upper metal layer 152, at least one upper metallic barrier layer (154, 156), and a dielectric cap 158 may be formed. The stack of the upper metal layer 152, the at least one upper metallic barrier layer (154, 156), and the dielectric cap 158 may have vertically coincident sidewalls, i.e., sidewalls located within a same vertical plane. Each contiguous combination of an upper metal layer 152 and at least one upper metallic barrier layer (154, 156) constitutes an upper electrode 150 of a memory cell to be subsequently completed. The upper electrode 150 may have a lateral dimension in a range from 10 nm to 500 nm, such as from 30 nm to 100 nm, although lesser and greater lateral dimensions may also be used. The etch mask layer 157 may be subsequently removed, for example, by ashing.

Generally, the upper electrode 150 comprises an upper metal layer 152 comprising, and/or consisting essentially of, a second metal having a melting point higher than 2,000 degrees Celsius and at least one upper metallic barrier layer (154, 156). In one embodiment, the first metal of the continuous lower metal layer 136C comprises, and/or consists essentially of, an element selected from ruthenium, tantalum, tungsten, rhenium, niobium, molybdenum, osmium, and iridium, and the second metal of each upper metal layer 152 comprises, and/or consists essentially of, an element selected from ruthenium, tantalum, tungsten, rhenium, niobium, molybdenum, osmium, and iridium.

Figure 6:
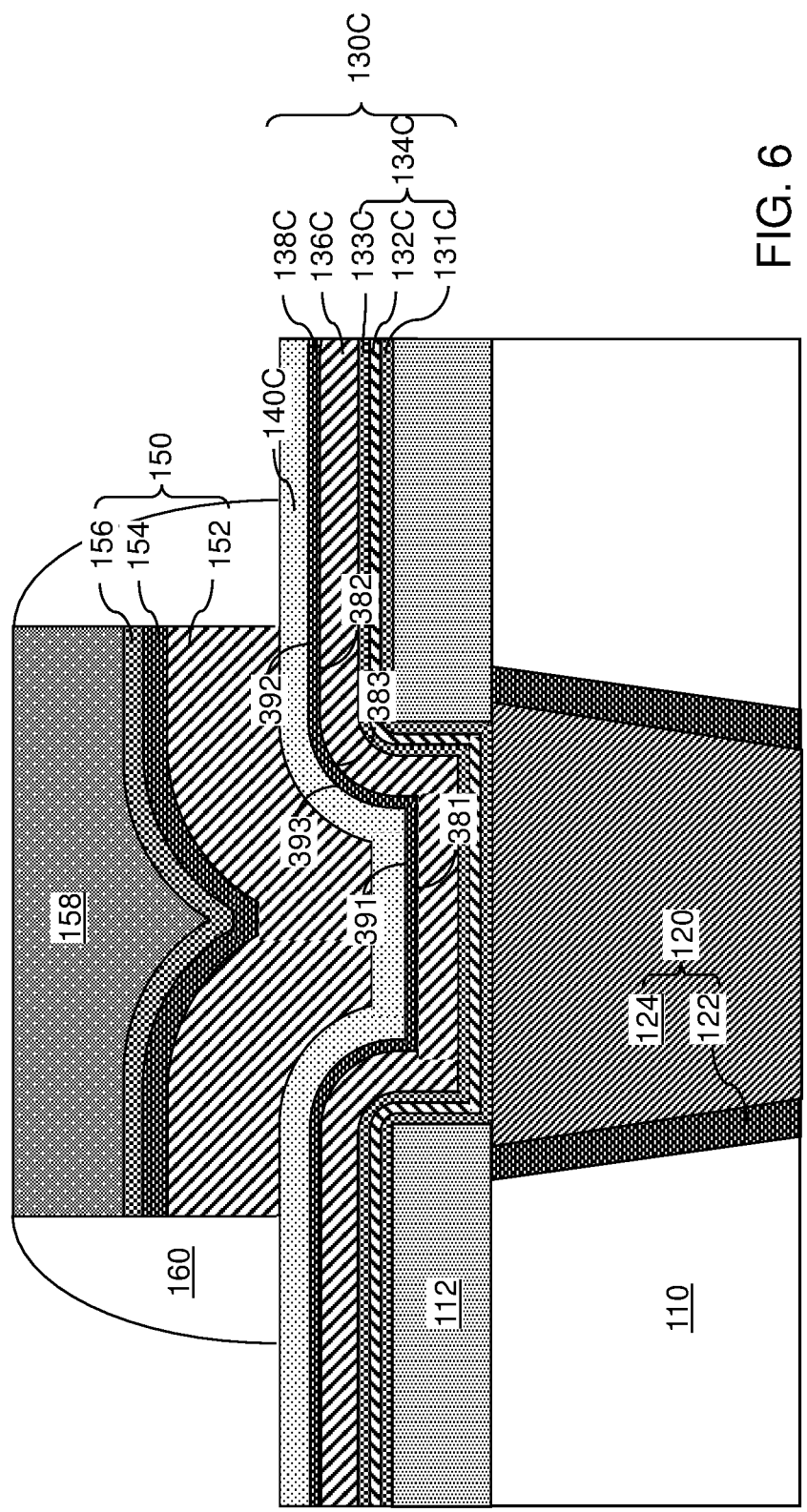
FIG. 6 is a vertical cross-sectional view of a memory cell region of the exemplary structure after formation of a dielectric spacer according to an embodiment of the present disclosure.

Referring to FIG. 6, a dielectric material layer may be conformally deposited by a conformal deposition process such as a chemical vapor deposition process. The dielectric material layer comprises, and/or consists essentially of, at least one dielectric material such as silicon oxide, silicon nitride, silicon oxynitride, silicon carbide, silicon carbide nitride, or a layer stack thereof. The thickness of the dielectric material layer may be in a range from 4 nm to 200 nm, such as from 8 nm to 100 nm, although lesser and greater thicknesses may also be used. In one embodiment, the material of the dielectric material layer may be different from the material of the dielectric caps 158.

A second anisotropic etch process may be performed to etch horizontal portions of the dielectric material layer. The second anisotropic etch process may be selective to the material of the dielectric caps 158, and may be optionally be selective to the material of the continuous resistive transition metal oxide layer 140C. Each remaining vertically-extending portion of the dielectric material layer comprises a dielectric spacer 160 that laterally surrounds a respective stack of an upper electrode 150 and a dielectric cap 158. Each dielectric spacer 160 may contact sidewalls of a respective stack of an upper electrode 150 and a dielectric cap 158. Each dielectric spacer 160 may have a respective straight vertical inner sidewall and a respective tapered convex outer sidewall. The lateral distance between a straight vertical inner sidewall and a tapered convex outer sidewall may decrease with a vertical distance from the horizontal plane including the topmost surface of the continuous resistive transition metal oxide layer 140C.

Figure 7:
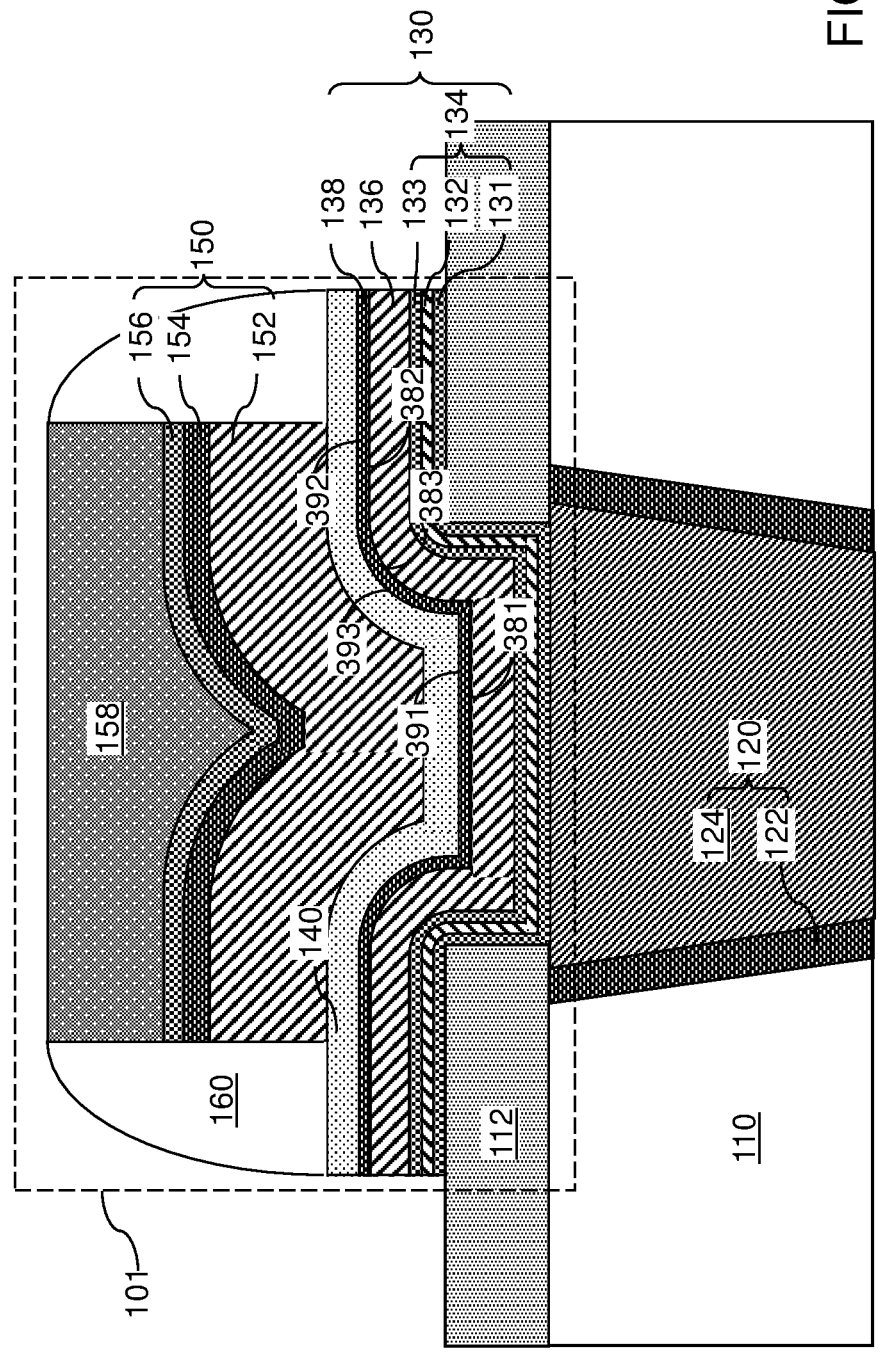
FIG. 7 is a vertical cross-sectional view of a memory cell region of the exemplary structure after patterning the continuous resistive transition metal oxide layer, the continuous transition metal compound layer, the continuous lower metal layer, and the at least one continuous lower metallic barrier layer according to an embodiment of the present disclosure.

Referring to FIG. 7, a third anisotropic etch process may be performed to etch portions of the continuous resistive transition metal oxide layer 140C and the continuous lower electrode material layers 130C using the combination of the dielectric caps 158 and the dielectric spacers 160 as an etch mask. The dielectric etch stop layer 112 may be used as an etch stop structure for the third anisotropic etch process.

Each patterned portion of the continuous resistive transition metal oxide layer 140C comprises a resistive transition metal oxide layer 140. Each patterned portion of the continuous transition metal compound layer 138C comprises a transition metal compound layer 138. Each patterned portion of the continuous lower metal layer 136C comprises a lower metal layer 136. Each patterned portion of the at least one continuous lower metallic barrier layer 134C comprises at least one lower metallic barrier layer 134. In one embodiment, the at least one lower metallic barrier layer 134 may comprise a layer stack including, from bottom to top, a first lower metallic barrier layer 131, a second lower metallic barrier layer 132, and a third lower metallic barrier layer 133. The first lower metallic barrier layer 131 is a patterned remaining portion of the first continuous lower metallic barrier layer 131C. The second lower metallic barrier layer 132 is a patterned remaining portion of the second continuous lower metallic barrier layer 132C. The third lower metallic barrier layer 133 is a patterned remaining portion of the third continuous lower metallic barrier layer 133C. The first lower metallic barrier layer 131, the second lower metallic barrier layer 132, and the third lower metallic barrier layer 133 within each layer stack may have vertically coincident sidewalls.

Each contiguous combination of at least one lower metallic barrier layer 134, a lower metal layer 136, and a transition metal compound layer 138 constitutes a lower electrode 130. Each resistive transition metal oxide layer 140 may be formed between a respective underlying lower electrode 130 and a respective overlying upper electrode 150. Each contiguous combination of a lower electrode 130, a resistive transition metal oxide layer 140, an upper electrode 150, a dielectric spacer 160, and a dielectric cap 158 constitutes a resistive memory cell 101. Sidewalls of the lower electrode 130 and the resistive transition metal oxide layer 140 within each resistive memory cell may be vertically coincident. Sidewalls of the upper electrode 150 may be laterally recessed inward with respect to sidewalls of the lower electrode 130 and the resistive transition metal oxide layer 140 within each resistive memory cell. The lower electrode 130 may have a lateral dimension in a range from 15 nm to 1,000 nm, such as from 40 nm to 150 nm, although lesser and greater lateral dimensions may also be used. The ratio of the lateral dimension of the lower electrode 130 to the lateral dimension of the upper electrode 130 may be in a range from 1.1 to 3, such as from 1.2 to 2, although lesser and greater ratios may also be used.

In one embodiment, the lower electrode 130 comprises at least one lower metallic barrier layer 134, a lower metal layer 136 comprising a first metal having a melting point higher than 2,000 degrees Celsius, and a transition metal compound layer 138 comprising an oxide or nitride of a transition metal selected from Ti, Ta, and W. The resistive transition metal oxide layer 140 comprises a conductive-filament-forming dielectric oxide of at least one transition metal and is located on the transition metal compound layer 138. In one embodiment, the transition metal compound layer 138 comprises, and/or consists essentially of, a transition metal oxide material selected from titanium oxide and tantalum oxide, or a transition metal nitride material selected from titanium nitride, tantalum nitride, and tungsten nitride.

In one embodiment, the entirety of the top surface of the transition metal compound layer 138 may be in contact with the entirety of the bottom surface of the resistive transition metal oxide layer 140 within each resistive memory cell 101. In one embodiment, the conductive-filament-forming dielectric oxide of the resistive transition metal oxide layer 140 comprises a material selected from hafnium oxide, zirconium oxide, titanium oxide, hafnium zirconium oxide, and strontium cobalt oxide. In one embodiment, each resistive memory cell 101 comprises a dielectric spacer 160 laterally surrounding the upper electrode 150.

Within each resistive memory cell 101, the entirety of the bottom surface of the upper metal layer 152 may contact a center portion of a top surface of the resistive transition metal oxide layer 140, and the entirety of the bottom surface of the dielectric spacer 160 may contact a peripheral portion of the top surface of the resistive transition metal oxide layer 140. In one embodiment, each resistive memory cell 101 comprises a dielectric cap 158 contacting a top surface of the upper electrode 150. A periphery of the bottom surface of the dielectric cap 158 coincides with a periphery of a top surface of the upper electrode 150.

In one embodiment, the dielectric etch stop layer 112 including an opening under each resistive memory cell 101. For each resistive memory cell 101, a center portion of the lower electrode 130 is located within an opening in the dielectric etch stop layer 112. A peripheral portion of the lower electrode 130 is locate outside the opening above a top surface of the dielectric etch stop layer 112. A cylindrical connection portion of the lower electrode 130 contacts a sidewall of the opening and vertically extends between the center portion of the lower electrode 130 and the peripheral portion of the lower electrode 130.

In one embodiment, the transition metal compound layer 138 comprises a bottom surface including a planar central bottom surface segment 381 located within an area of the opening through the dielectric etch stop layer 112, a planar peripheral bottom surface segment 382 located outside the area of the opening through the dielectric etch stop layer 112, and a concave connecting bottom surface segment 383 that connects the planar central bottom surface segment 381 and the planar peripheral bottom surface segment 382. In one embodiment, the transition metal compound layer 138 comprises a top surface including a planar central top surface segment 391 located within an area of the opening through the dielectric etch stop layer 112, a planar peripheral top surface segment 392 located outside the area of the opening through the dielectric etch stop layer 112, and a convex connecting top surface segment 393 that connects the planar central top surface segment 391 and the planar peripheral top surface segment 392.

Generally, the layer stack including the at least one continuous lower metallic barrier layer 134C, the continuous lower metal layer 136C, the continuous transition metal compound layer 138C, the continuous resistive transition metal oxide layer 140C, the continuous upper metal layer 152C, the at least one continuous upper metallic barrier layer (154C, 156C), and the continuous dielectric cap layer 158C may be patterned using at least one anisotropic etch process. Patterned portions of the layer stack comprise: an upper electrode 150 that includes patterned portions of the at least one continuous upper metallic barrier layer (154C, 156C) and the continuous upper metal layer 152C; a resistive transition metal oxide layer 140 that includes a patterned portion of the continuous resistive transition metal oxide layer 140C; and a lower electrode 130 that includes patterned portions of the at least one continuous lower metallic barrier layer 134C, the continuous lower metal layer 136C, and the continuous transition metal compound layer 138C.

Figure 8:
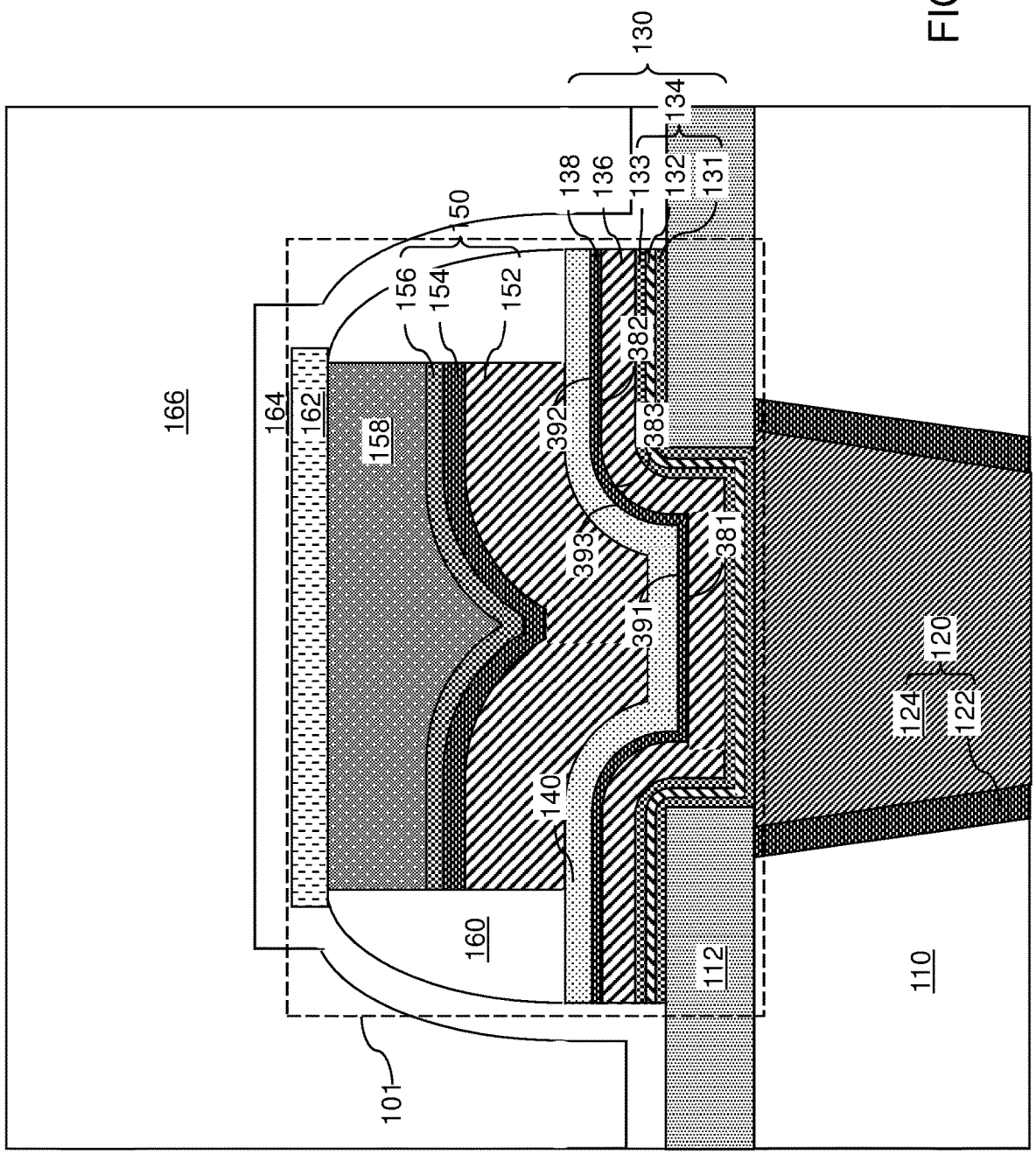
FIG. 8 is a vertical cross-sectional view of a memory cell region of the exemplary structure after formation of an etch mask structure, a dielectric liner, and an upper-level dielectric material layer according to an embodiment of the present disclosure.

Referring to FIG. 8, an etch stop plate 162 may be optionally formed over each dielectric cap 158, for example, by deposition of an etch stop material layer and by patterning the etch stop material layer into an array of discrete etch stop plates 162. The etch stop material layer may be deposited by chemical vapor deposition or physical vapor deposition. For example, a photoresist layer may be applied over the etch stop material layer, and may be lithographically patterned to cover areas of the dielectric caps 158. An etch process may be performed to etch unmasked portions of the etch stop material layer using the patterned photoresist layer as an etch mask. Remaining portions of the etch stop material layer comprise the etch stop plates 162. The photoresist layer may be subsequently removed, for example, by ashing.

In one embodiment, the etch stop plates 162 may include a dielectric material such as a dielectric metal oxide. For example, the etch stop plate 162 may include aluminum oxide, hafnium oxide, lanthanum oxide, or another dielectric metal oxide material. In another embodiment, the etch stop plates 162 may include a metallic material such as a conductive metallic nitride material (e.g., tantalum nitride, titanium nitride, or tungsten nitride) or a conductive metal (e.g., titanium, tantalum, tungsten, ruthenium, molybdenum, or cobalt). The thickness of the etch stop plates 162 may be in a range from 4 nm to 100 nm, such as from 8 nm to 50 nm, although lesser and greater thicknesses may also be used.

A dielectric liner 164 may be optionally deposited over the physically exposed surfaces of the dielectric etch stop layer 112, the resistive memory cells 101, and the etch stop plates 162. The dielectric liner 164 may include a non-porous dielectric material such as undoped silicate glass, a doped silicate glass, silicon oxynitride, or silicon nitride. The dielectric liner 164 may be deposited by a conformal deposition process such as a chemical vapor deposition process. The thickness of the dielectric liner 164 may be in a range from 4 nm to 100 nm, such as from 8 nm to 50 nm, although lesser and greater thicknesses may also be used.

A dielectric material layer may be subsequently deposited over the dielectric liner 164. The dielectric material layer is herein referred to as an upper-level dielectric material layer 166. In one embodiment, the upper-level dielectric material layer 166 may include a low-k dielectric material having a dielectric constant less than 3.9. For example, the upper-level dielectric material layer 166 may include non-porous organosilicate glass or porous organosilicate glass. Optionally, the top surface of the upper-level dielectric material layer 166 may be planarized. The thickness of the upper-level dielectric material layer 166 as measured above the topmost surfaces of the dielectric liner 164 overlying the resistive memory cells 101 may be in a range from 50 nm to 1,000 nm, such as from 100 nm to 500 nm, although lesser and greater thicknesses may also be used.

Figure 9:
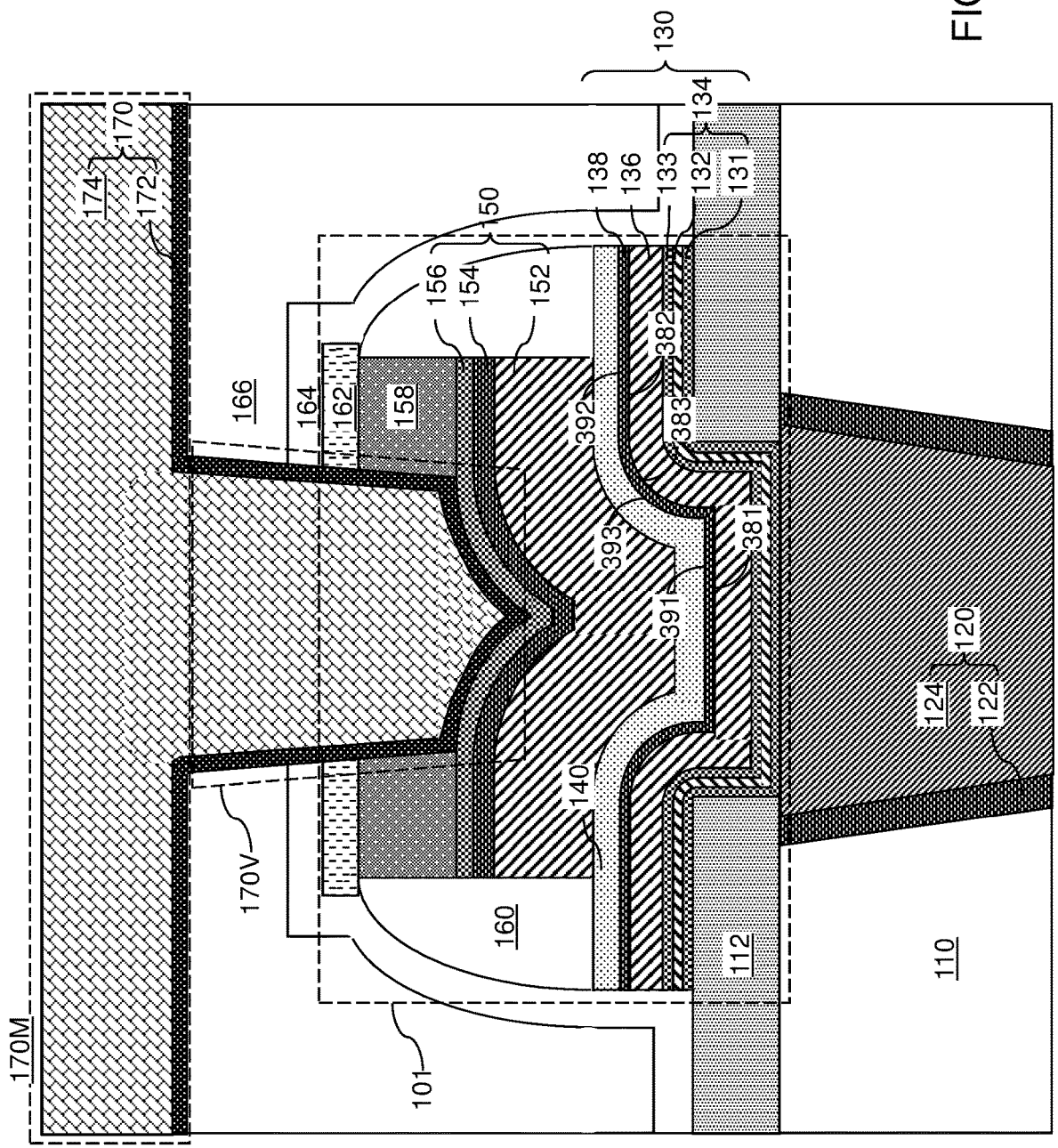
FIG. 9 is a vertical cross-sectional view of a memory cell region of the exemplary structure after formation of upper connection via structures and upper connection metal lines according to an embodiment of the present disclosure.
Figure 10:
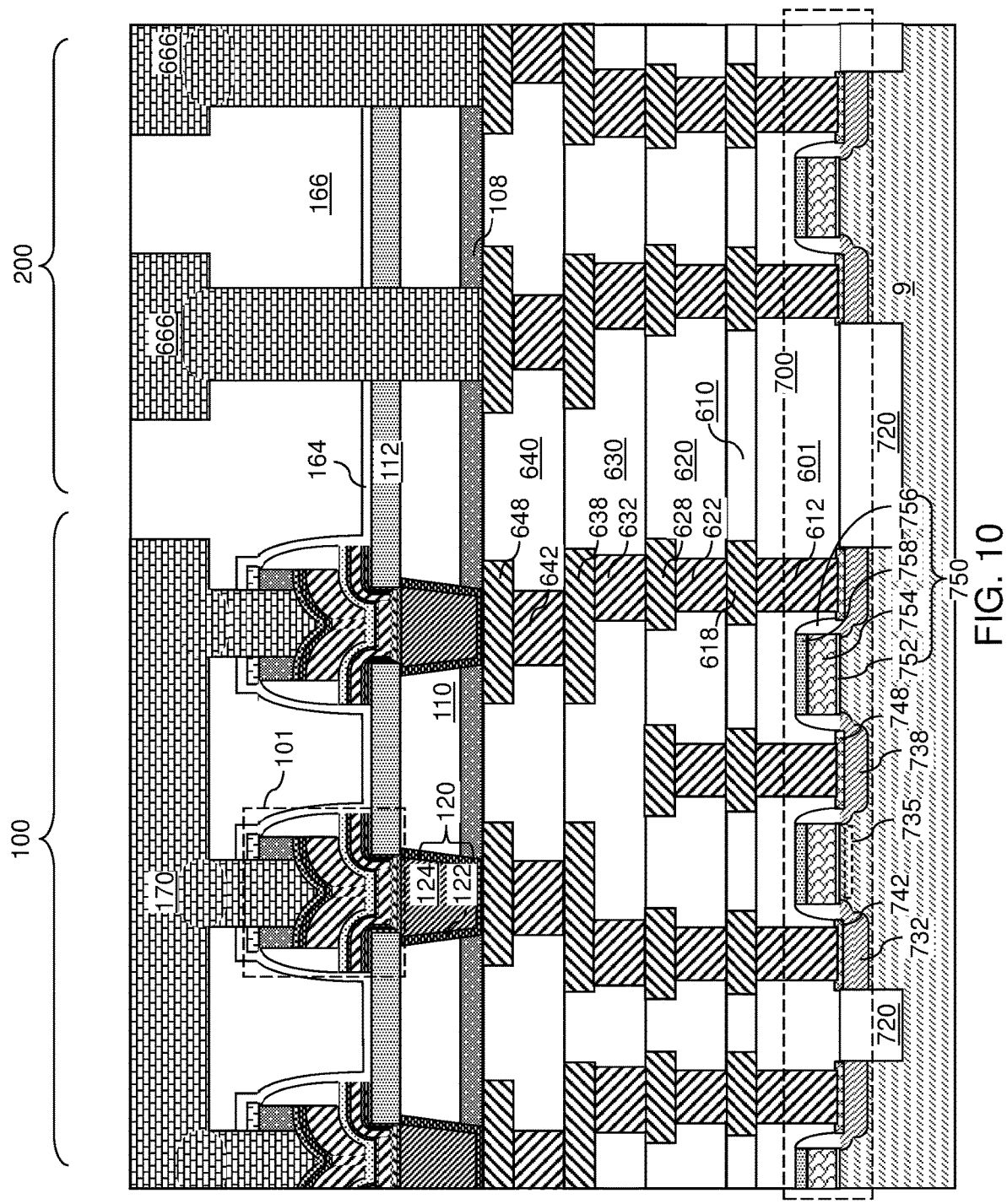
FIG. 10 is a vertical cross-sectional view of the exemplary structure at the processing steps of FIG. 9.

Referring to FIGS. 9 and 10, a first photoresist layer may be applied over the top surface of the upper-level dielectric material layer 166, and may be lithographically patterned to form an array of openings. Each opening in the first photoresist layer may overlie a respective one of the resistive memory cells 101. In one embodiment, each opening in the first photoresist layer that overlies a resistive memory cell 101 may have a periphery that is located entirely within a periphery of an underlying upper electrode 150. An anisotropic etch process may be performed to transfer the pattern of the openings in the first photoresist layer through the upper-level dielectric material layer 166, the dielectric liner 164, the etch stop plates 162, and the dielectric caps 158. A via cavity may be formed through the upper-level dielectric material layer 166, the dielectric liner 164, the etch stop plates 162, and the dielectric caps 158 over each resistive memory cell 101. A top surface of an upper electrode 150 may be physically exposed underneath each via cavity. The first photoresist layer may be subsequently removed, for example, by ashing.

A second photoresist layer may be applied over the top surface of the upper-level dielectric material layer 166, and may be lithographically patterned to form a line and space pattern. Each space between a pair of line patterns may overlie a respective row of resistive memory cells 101, or may overlie a respective column of resistive memory cells 101. An anisotropic etch process may be performed to transfer the pattern in the second photoresist layer into an upper portion of the upper-level dielectric material layer 166. The anisotropic etch process may be selective to the material of the upper electrodes 150. Line trenches may be formed in the upper portion of the upper-level dielectric material layer 166. The line trenches laterally connect a respective row of via cavities or a respective column of via cavities. The second photoresist layer may be subsequently removed, for example, by ashing.

At least one conductive material may be deposited in the via cavities and line trenches. The at least one conductive material may include a metallic barrier liner 172 and a metallic fill material portion 174. The metallic barrier liner 172 may include a conductive metallic nitride material such as tantalum nitride, titanium nitride, or tungsten nitride. The metallic barrier liner 172 may be deposited by physical vapor deposition and/or chemical vapor deposition. The thickness of the metallic barrier liner 172 may be in a range from 4 nm to 50 nm, such as from 8 nm to 25 nm, although lesser and greater thicknesses may also be used. The metallic fill material portion 174 includes a metallic fill material such as copper, aluminum, tungsten, molybdenum, ruthenium, cobalt, or an alloy or a layer stack thereof. The metallic fill material portion 174 may be deposited by physical vapor deposition, chemical vapor deposition, electroplating, electroless plating, or a combination thereof.

Excess portions of the metallic barrier liner 172 and the metallic fill material portion 174 may be removed from above the horizontal plane including the topmost surface of the upper-level dielectric material layer 166 by a planarization process. The planarization process may use, for example, a chemical mechanical planarization process and/or a recess etch process. Each remaining patterned portion of the metallic barrier liner 172 and the metallic fill material portion 174 that fills a respective combination of a line trench and via cavities constitutes an integrated line-and-via structure 170. Each integrated line-and-via structure 170 may include a respective upper connection metal line 170M and a respective one-dimensional array of upper connection via structures 170V.

Each lower via connection via structure 120 may be used to provide electrical connection to a lower electrode 130. Each upper via connection via structure 170V may be used to provide electrical connection to an upper electrode 150. Each upper connection via structure 170V may be formed on a top surface of a respective upper electrode 150. Generally, a dielectric material layer (such as the upper-level dielectric material layer 166) laterally surrounds the resistive memory cells 101. The dielectric material layer may have a top surface located above the horizontal top surfaces of the dielectric caps 158, and each upper connection via structure 170V may vertically extend through the dielectric material layer and a respective dielectric cap 158, and may contact a top surface of a respective upper electrode 150.

Memory-level metal interconnect structures 666 may be formed in the upper-level dielectric material layer 166 concurrently with formation of the integrated line-and-via structures 170. For example, additional via cavities may be formed in the peripheral region 200 concurrently with formation of via cavities in the memory array region 100, and additional line trenches may be formed in the peripheral region 200 concurrently with formation of the line trenches in the memory array region 100. The integrated line-and-via structures 170 and the memory-level metal interconnect structures 666 comprise upper-level metal interconnect structures (170, 666), i.e., metal interconnect structures that are formed in an upper interconnect level. Additional upper-level dielectric material layers (not shown) and additional upper-level metal interconnect structures (not shown) may be formed above the upper-level metal interconnect structures (170, 666) as needed.

Referring to FIG. 11, a flowchart illustrates a sequence of processing steps for manufacturing a resistive memory device (such as a resistive memory cell 101) of the present disclosure.

Referring collectively to FIGS. 1 and 2 and step 1110 of FIG. 11, a lower connection via structure 120 may be formed through a lower-level dielectric material layer such as the lower connection-via-level dielectric layer 110.

Referring collectively to FIGS. 3 and 4 and step 1120 of FIG. 11, a layer stack including at least one continuous lower metallic barrier layer 134C, a continuous lower metal layer 136C, a continuous transition metal compound layer 138C, a continuous resistive transition metal oxide layer 140C, a continuous upper metal layer 152C, and at least one continuous upper metallic barrier layer (154C, 156C) may be formed over a substrate 9. The continuous lower metal layer 136C comprises, and/or consists essentially of, a first metal having a melting point higher than 2,000 degrees Celsius. The continuous transition metal compound layer 138C comprises, and/or consists essentially of, an oxide or nitride of a transition metal selected from Ti, Ta, and W. The continuous resistive transition metal oxide layer 140C comprises, and/or consists essentially of, a conductive-filament-forming dielectric oxide of at least one transition metal. The continuous upper metal layer 152C comprises, and/or consists essentially of, a second metal having a melting point higher than 2,000 degrees Celsius.

Referring collectively to FIGS. 5-7 and step 1130 of FIG. 11, the layer stack may be patterned using at least one anisotropic etch process. Patterned portions of the layer stack comprise: an upper electrode 150 that includes patterned portions of the at least one continuous upper metallic barrier layer (154C, 156C) and the continuous upper metal layer 152C; a resistive transition metal oxide layer 140 that includes a patterned portion of the continuous resistive transition metal oxide layer 140C; and a lower electrode 130 that includes patterned portions of the at least one continuous lower metallic barrier layer 134C, the continuous lower metal layer 136C, and the continuous transition metal compound layer 138C.

Referring collectively to FIG. 8 and step 1140 of FIG. 11, an upper-level dielectric material layer 166 may be formed around, and over, the resistive memory cell 101.

Referring collectively to FIGS. 9 and 10 and step 1150 of FIG. 11, an upper connection via structure 170V may be formed on the upper electrode 150 of the resistive memory cell 101.

Referring to all drawings and according to various embodiments of the present disclosure, a device structure comprising a resistive memory cell 101 is provided. The resistive memory cell 101 comprises: a lower electrode 130 comprising at least one lower metallic barrier layer 134, a lower metal layer 136 comprising a first metal having a melting point higher than 2,000 degrees Celsius, and a transition metal compound layer 138 comprising an oxide or nitride of a transition metal selected from Ti, Ta, and W; a resistive transition metal oxide layer 140 comprising a conductive-filament-forming dielectric oxide of at least one transition metal and located on the transition metal compound layer; and an upper electrode 150 comprising an upper metal layer 152.

In one embodiment, the transition metal compound layer 138 comprises, and/or consists essentially of, a transition metal oxide material selected from titanium oxide and tantalum oxide. In one embodiment, the transition metal compound layer 138 comprises, and/or consists essentially of, a transition metal nitride material selected from titanium nitride, tantalum nitride, and tungsten nitride.

In one embodiment, an entirety of a top surface of the transition metal compound layer 138 is in contact with an entirety of a bottom surface of the resistive transition metal oxide layer 140. In one embodiment, the conductive-filament-forming dielectric oxide comprises a material selected from hafnium oxide, zirconium oxide, titanium oxide, hafnium zirconium oxide, and strontium cobalt oxide.

In one embodiment, the resistive memory cell 101 comprises a dielectric spacer 160 laterally surrounding the upper electrode 150. In one embodiment, an entirety of a bottom surface of the upper metal layer 152 contacts a center portion of a top surface of the resistive transition metal oxide layer 140; and an entirety of a bottom surface of the dielectric spacer 160 contacts a peripheral portion of the top surface of the resistive transition metal oxide layer 140.

In one embodiment, the resistive memory cell 101 comprises a dielectric cap 158 contacting a top surface of the upper electrode 150, wherein a periphery of a bottom surface of the dielectric cap 158 coincides with a periphery of a top surface of the upper electrode 150. In one embodiment, the device structure comprises: a dielectric material layer (such as an upper-level dielectric material layer 166) laterally surrounding the resistive memory cell 101 and having a top surface located above a horizontal top surface of the dielectric cap 158; and an upper connection via structure 170V vertically extending through the dielectric material layer 166 and the dielectric cap 158 and contacting a top surface of the upper electrode 150.

In one embodiment, the device structure comprises a dielectric etch stop layer 112 including an opening. A center portion of the lower electrode 130 is located within the opening; a peripheral portion of the lower electrode 130 is locate outside the opening above a top surface of the dielectric etch stop layer 112; and a cylindrical connection portion of the lower electrode 130 contacts a sidewall of the opening and vertically extends between the center portion of the lower electrode 130 and the peripheral portion of the lower electrode 130.

In one embodiment, transition metal compound layer 138 comprises a bottom surface including a planar central bottom surface segment 381 located within an area of the opening through the dielectric etch stop layer 112, a planar peripheral bottom surface segment 382 located outside the area of the opening through the dielectric etch stop layer 112, and a concave connecting bottom surface segment that connects the planar central bottom surface segment 381 and the planar peripheral bottom surface segment 382. In one embodiment, transition metal compound layer 138 comprises a top surface including a planar central top surface segment 391 located within an area of the opening through the dielectric etch stop layer 112, a planar peripheral top surface segment 392 located outside the area of the opening through the dielectric etch stop layer 112, and a convex connecting top surface segment 393 that connects the planar central top surface segment 391 and the planar peripheral top surface segment 392.

In one embodiment, the first metal comprises an element selected from ruthenium, tantalum, tungsten, rhenium, niobium, molybdenum, osmium, and iridium; and the second metal comprises an element selected from ruthenium, tantalum, tungsten, rhenium, niobium, molybdenum, osmium, and iridium.

In one embodiment, the at least one lower metallic barrier layer 134 comprises a lower vertical stack including, from bottom to top, a first lower tantalum nitride layer (comprising a first lower metallic barrier layer 131), a lower tantalum layer (comprising a second lower metallic barrier layer 132), and a second lower tantalum nitride layer (comprising a third lower metallic barrier layer 133); and the at least one upper metallic barrier layer (154, 156) comprises an upper vertical stack including, from bottom to top, an upper tantalum nitride layer (comprising a first upper metallic barrier layers 154) and a titanium nitride layer (comprising a second upper metallic barrier layers 156).

According to another aspect of the present disclosure, a plurality of resistive memory cells 101 may be arranged in a two-dimensional array. In this embodiment, the CMOS circuitry 700 may include a periphery circuit for operating the two-dimensional array of the resistive memory cells 101. The CMOS circuitry 700 may include a two-dimensional array of access transistors for programming, erasing, and reading each of the resistive memory cells 101. The lower-level metal interconnect structures (612, 618, 622, 628, 632, 638, 642, 648) and the upper-level metal interconnect structures (170, 666) provide electrical connection between the various nodes of the CMOS circuitry and the lower electrodes 130 and the upper electrodes 150 of the resistive memory cells 101.

Referring to all drawings and according to various embodiments of the present disclosure, a resistive random access memory (RRAM) device is provided, which comprises: an array of resistive memory cells 101 located over a substrate 9 and comprising a respective lower electrode 130, a respective resistive transition metal oxide layer 140, and a respective upper electrode 150; field effect transistors located on the substrate 9; first metal interconnect structures (such as a subset of the lower-level metal interconnect structures (612, 618, 622, 628, 632, 638, 642, 648)) electrically connecting first nodes of the field effect transistors to the lower electrodes 130 within the array of resistive memory cells 101; and second metal interconnect structures (such as a subset of the lower-level metal interconnect structures (612, 618, 622, 628, 632, 638, 642, 648) and the upper-level metal interconnect structures (170, 666) electrically connecting second nodes of the field effect transistors to the upper electrodes 150 within the array of resistive memory cells 101. Each lower electrode 130 comprises at least one lower metallic barrier layer 134, a lower metal layer 136 comprising ruthenium, and a transition metal compound layer 138 comprises, and/or consists essentially of, an oxide or nitride of a transition metal selected from Ti, Ta, and W; each resistive transition metal oxide layer 140 comprises, and/or consists essentially of, a conductive-filament-forming dielectric oxide of at least one transition metal; and each upper electrode 150 comprises an upper metal layer comprising a second metal having a melting point higher than 2,000 degrees Celsius and at least one upper metallic barrier layer.

In one embodiment, the transition metal compound layer 138 comprises: a transition metal oxide material selected from titanium oxide and tantalum oxide; or a transition metal nitride material selected from titanium nitride, tantalum nitride, and tungsten nitride.

In an experiment designed to verify the efficacy of an embodiment of the present disclosure, a device including an array of resistive memory cells 101 of the present disclosure was constructed. In this example, the lower metal layer 136 included ruthenium, and the transition metal compound layer 138 included 3.8 nm thick tantalum nitride deposited by physical vapor deposition or atomic layer deposition. Nitrogen treatment was performed after deposition of the tantalum nitride material. After an endurance test of over 200,000 cycles of programming and erasing, the failure rate of the resistive memory cells of the present disclosure was below detection limit. Without wishing to be bound by any particular theory, it is believed that the transition metal compound layer 138 reduces interfacial surface roughness between the lower metal layer 136 and the resistive transition metal oxide layer 140, thereby increasing the endurance of the resistive memory cell 101 of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising a resistive memory cell, wherein the resistive memory cell comprises:
   a lower electrode comprising at least one lower metallic barrier layer, a lower metal layer comprising a first metal having a melting point higher than 2,000 degrees Celsius, and a transition metal compound layer comprising an oxide or nitride of a transition metal selected from Ti, Ta, and W;
   a resistive transition metal oxide layer comprising a conductive-filament-forming dielectric oxide of at least one transition metal and located on the transition metal compound layer; and
   an upper electrode comprising an upper metal layer comprising a second metal.

2. The device structure of claim 1, wherein the transition metal compound layer comprises a transition metal oxide material selected from titanium oxide and tantalum oxide.

3. The device structure of claim 1, wherein the transition metal compound layer comprises a transition metal nitride material selected from titanium nitride, tantalum nitride, and tungsten nitride.

4. The device structure of claim 1, wherein an entirety of a top surface of the transition metal compound layer is in contact with an entirety of a bottom surface of the resistive transition metal oxide layer.

5. The device structure of claim 1, wherein the conductive-filament-forming dielectric oxide comprises a material selected from hafnium oxide, zirconium oxide, titanium oxide, hafnium zirconium oxide, and strontium cobalt oxide.

6. The device structure of claim 1, wherein the resistive memory cell comprises a dielectric spacer laterally surrounding the upper electrode.

7. The device structure of claim 6, wherein:
   an entirety of a bottom surface of the upper metal layer contacts a center portion of a top surface of the resistive transition metal oxide layer; and
   an entirety of a bottom surface of the dielectric spacer contacts a peripheral portion of the top surface of the resistive transition metal oxide layer.

8. The device structure of claim 6, wherein the resistive memory cell comprises a dielectric cap contacting a top surface of the upper electrode, wherein a periphery of a bottom surface of the dielectric cap coincides with a periphery of a top surface of the upper electrode.

9. The device structure of claim 8, further comprising:
a dielectric material layer laterally surrounding the resistive memory cell and having a top surface located above a horizontal top surface of the dielectric cap; and
an upper connection via structure vertically extending through the dielectric material layer and the dielectric cap and contacting a top surface of the upper electrode.

10. The device structure of claim 1, further comprising a dielectric etch stop layer including an opening, wherein:
a center portion of the lower electrode is located within the opening;
a peripheral portion of the lower electrode is locate outside the opening above a top surface of the dielectric etch stop layer; and
a cylindrical connection portion of the lower electrode contacts a sidewall of the opening and vertically extends between the center portion of the lower electrode and the peripheral portion of the lower electrode.

11. The device structure of claim 10, wherein the transition metal compound layer comprises:
a bottom surface including a planar central bottom surface segment located within an area of the opening through the dielectric etch stop layer, a planar peripheral bottom surface segment located outside the area of the opening through the dielectric etch stop layer, and a concave connecting bottom surface segment that connects the planar central bottom surface segment and the planar peripheral bottom surface segment; and
a top surface including a planar central top surface segment located within an area of the opening through the dielectric etch stop layer, a planar peripheral top surface segment located outside the area of the opening through the dielectric etch stop layer, and a convex connecting top surface segment that connects the planar central top surface segment and the planar peripheral top surface segment.

12. The device structure of claim 1, wherein:
the first metal comprises an element selected from ruthenium, tantalum, tungsten, rhenium, niobium, molybdenum, osmium, and iridium; and
the second metal comprises an element selected from ruthenium, tantalum, tungsten, rhenium, niobium, molybdenum, osmium, and iridium.

13. The device structure of claim 1, wherein:
the at least one lower metallic barrier layer comprises a lower vertical stack including, from bottom to top, a first lower tantalum nitride layer, a lower tantalum layer, and a second lower tantalum nitride layer; and
the upper electrode comprises at least one upper metallic barrier layer, which comprises an upper vertical stack including, from bottom to top, an upper tantalum nitride layer and a titanium nitride layer.

14. A device structure comprising a resistive memory cell, wherein the resistive memory cell comprises:
a lower electrode comprising at least one lower metallic barrier layer, a lower metal layer comprising a first metal having a melting point higher than 2,000 degrees Celsius, and a transition metal compound layer comprising an oxide or nitride of a transition metal selected from Ti, Ta, and W;
a resistive transition metal oxide layer comprising a conductive-filament-forming dielectric oxide of at least one transition metal and located on the transition metal compound layer;
an upper electrode comprising an upper metal layer comprising a second metal; and
a dielectric spacer laterally surrounding the upper electrode, wherein a bottom periphery of an outer sidewall of the dielectric spacer coincides with a periphery of a top surface of the resistive transition metal oxide layer.

15. The device structure of claim 14, wherein the bottom periphery of the outer sidewall of the dielectric spacer is laterally offset outward from a bottom periphery of an inner sidewall of the dielectric spacer by a uniform lateral offset distance.

16. The device structure of claim 14, wherein the resistive transition metal oxide layer comprises:
a peripheral portion in contact with the dielectric spacer;
a center portion that is vertically recessed relative to the peripheral portion; and
a tapered annular connecting portion that connects the peripheral portion and the center portion.

17. The device structure of claim 14, wherein the upper metal layer comprises downward protrusion at a center region thereof, wherein the downward protrusion extends below a horizontal plane including an annular horizontal bottom surface of a peripheral portion of the resistive transition metal oxide layer.

18. The device structure of claim 14, wherein the conductive-filament-forming dielectric oxide comprises a material selected from hafnium oxide, zirconium oxide, titanium oxide, hafnium zirconium oxide, and strontium cobalt oxide.

19. A device structure comprising a resistive memory cell, wherein the resistive memory cell comprises:
a dielectric etch stop layer including an opening therethrough;
a lower electrode comprising at least one lower metallic barrier layer, a lower metal layer comprising a first metal having a melting point higher than 2,000 degrees Celsius, and a transition metal compound layer comprising an oxide or nitride of a transition metal selected from Ti, Ta, and W, wherein the lower electrode comprises a peripheral portion overlying the dielectric etch stop layer and a center portion located within the opening in the dielectric etch stop layer;
a resistive transition metal oxide layer comprising a conductive-filament-forming dielectric oxide of at least one transition metal and located on the transition metal compound layer; and
an upper electrode comprising an upper metal layer comprising a second metal.

20. The device structure of claim 19, wherein the transition metal compound layer comprises:
a bottom surface including a planar central bottom surface segment located within an area of the opening through the dielectric etch stop layer, a planar peripheral bottom surface segment located outside the area of the opening through the dielectric etch stop layer, and a concave connecting bottom surface segment that connects the planar central bottom surface segment and the planar peripheral bottom surface segment; and
a top surface including a planar central top surface segment located within an area of the opening through the dielectric etch stop layer, a planar peripheral top surface segment located outside the area of the opening through the dielectric etch stop layer, and a convex connecting top surface segment that connects the planar central top surface segment and the planar peripheral top surface segment.

* * * * *